(12) United States Patent
Bae et al.

(10) Patent No.: US 10,651,263 B2
(45) Date of Patent: May 12, 2020

(54) DISPLAY DEVICE

(71) Applicant: Samsung Display Co., Ltd., Yongin-si (KR)

(72) Inventors: Joo-Han Bae, Seongnam-si (KR); Jung Ho Park, Hwaseong-si (KR); Jeong Kug Lee, Seoul (KR); Jae Won Choi, Hwaseong-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 0 days.

(21) Appl. No.: 15/680,126

(22) Filed: Aug. 17, 2017

(65) Prior Publication Data

US 2018/0083088 A1    Mar. 22, 2018

(30) Foreign Application Priority Data

Sep. 19, 2016    (KR) ......................... 10-2016-0119276

(51) Int. Cl.
*G06F 1/16*        (2006.01)
*G06F 3/041*      (2006.01)
(Continued)

(52) U.S. Cl.
CPC .......... *H01L 27/3279* (2013.01); *G06F 3/044* (2013.01); *G06F 3/0412* (2013.01);
(Continued)

(58) Field of Classification Search
CPC ............... G06F 3/0412; G06F 3/044; G06F 2203/04111; G06F 2203/04112;
(Continued)

(56) References Cited

U.S. PATENT DOCUMENTS 6,035,180 A  *  3/2000  Kubes .................. G06F 3/03547
                                                          455/575.1
7,511,295 B2    3/2009  Kim et al.
(Continued)

FOREIGN PATENT DOCUMENTS

KR    10-0484400    4/2005
KR    10-0683677    2/2007
(Continued)

*Primary Examiner* — Michael J Eurice
(74) *Attorney, Agent, or Firm* — H.C. Park & Associates, PLC

(57) ABSTRACT

A display device includes: a first substrate; a display area with a plurality of pixels on the first substrate; a pad portion adjacent to a first side of the display area and including a plurality of connecting pads positioned on the first substrate; a first common power wire positioned between the display area and the pad portion and connected to a first connecting pad as at least one of the plurality of connecting pads to receive a power voltage; a second common power wire positioned adjacent to a second side of the display area facing the first side; an encapsulation layer positioned on the display area to protect the plurality of pixels; and a first path wire including one end connected to a second connecting pad of the plurality of connecting pads and the other end connected to the second common power wire and positioned on the encapsulation layer.

18 Claims, 18 Drawing Sheets

(51) Int. Cl.
  *G06F 3/044* (2006.01)
  *H01L 27/32* (2006.01)
  *H01L 51/52* (2006.01)
  *G09G 3/3233* (2016.01)
(52) U.S. Cl.
  CPC ......... *G09G 3/3233* (2013.01); *H01L 27/323* (2013.01); *H01L 27/3297* (2013.01); *H01L 51/5256* (2013.01); *G06F 2203/04111* (2013.01); *G06F 2203/04112* (2013.01); *G09G 2300/0426* (2013.01); *G09G 2320/0233* (2013.01); *G09G 2330/023* (2013.01); *G09G 2330/028* (2013.01); *H01L 27/3276* (2013.01); *H01L 27/3288* (2013.01); *H01L 51/5237* (2013.01); *H01L 51/5253* (2013.01)
(58) Field of Classification Search
  CPC ......... G09G 3/3233; G09G 2300/0426; G09G 2320/0233; G09G 2330/023; G09G 2330/028; H01L 27/323; H01L 27/3276; H01L 27/3279; H01L 27/3288; H01L 27/3297; H01L 51/5237; H01L 51/5253; H01L 51/5256
  See application file for complete search history.

(56) References Cited

U.S. PATENT DOCUMENTS

| | | | |
|---|---|---|---|
| 8,436,529 B2 | 5/2013 | Ko et al. | |
| 9,287,329 B1* | 3/2016 | Lee | H01L 51/0097 |
| 9,356,087 B1* | 5/2016 | Lee | H01L 27/3276 |
| 10,038,154 B2* | 7/2018 | Lee | H01L 51/0097 |
| 2003/0076046 A1* | 4/2003 | Komiya | H01L 27/3276 315/169.3 |
| 2003/0111966 A1* | 6/2003 | Mikami | G09G 3/3233 315/169.3 |
| 2003/0193056 A1* | 10/2003 | Takayama | G02F 1/136286 257/79 |
| 2004/0004444 A1* | 1/2004 | Choi | G09G 3/3208 315/169.2 |
| 2004/0061694 A1* | 4/2004 | Noguchi | G09G 3/3233 345/204 |
| 2004/0108977 A1* | 6/2004 | Hirayama | G09G 3/20 345/76 |
| 2004/0135520 A1* | 7/2004 | Park | H01L 27/3253 315/169.3 |
| 2004/0207315 A1* | 10/2004 | Robbie | G09G 3/3216 313/504 |
| 2004/0256996 A1* | 12/2004 | Osame | G09G 3/3233 315/169.1 |
| 2005/0035718 A1* | 2/2005 | Lee | G09G 3/3233 315/164 |
| 2005/0162081 A1* | 7/2005 | Kwak | H01L 27/3276 313/506 |
| 2005/0184672 A1* | 8/2005 | Lee | H01L 27/3279 315/169.3 |
| 2006/0077144 A1* | 4/2006 | Eom | G09G 3/32 345/82 |
| 2006/0170342 A1* | 8/2006 | Kim | H01L 27/3276 313/512 |
| 2007/0008266 A1* | 1/2007 | Kobashi | G09G 3/3677 345/90 |
| 2007/0096631 A1* | 5/2007 | Sung | G02F 1/1339 313/498 |
| 2007/0126728 A1* | 6/2007 | Peng | G09G 3/3233 345/211 |
| 2007/0176859 A1* | 8/2007 | Cok | G09G 3/3225 345/76 |
| 2008/0085652 A1* | 4/2008 | Winters | H01L 27/322 445/4 |
| 2009/0262046 A1* | 10/2009 | Nathan | G09G 3/3225 345/76 |
| 2009/0294163 A1* | 12/2009 | Yamamoto | G09G 3/3233 174/261 |
| 2010/0178833 A1* | 7/2010 | Su | H01L 27/3276 445/24 |
| 2010/0289729 A1* | 11/2010 | Nakamura | H01L 27/3276 345/76 |
| 2011/0127514 A1* | 6/2011 | Matsumuro | H01L 27/3276 257/40 |
| 2011/0285277 A1* | 11/2011 | Boerner | H01L 51/5203 313/504 |
| 2011/0285278 A1* | 11/2011 | Boerner | H01L 51/5203 313/504 |
| 2011/0291119 A1* | 12/2011 | Ryu | H01L 27/3276 257/88 |
| 2012/0001885 A1* | 1/2012 | Kang | H01L 27/329 345/211 |
| 2012/0044221 A1* | 2/2012 | Ko | H01L 27/3276 345/205 |
| 2012/0127217 A1* | 5/2012 | Tamaki | G09G 3/3233 345/690 |
| 2012/0162053 A1* | 6/2012 | Lee | H01L 27/3279 345/80 |
| 2012/0241408 A1* | 9/2012 | Misaki | G02F 1/1333 216/20 |
| 2012/0262397 A1* | 10/2012 | Im | H04M 1/00 345/173 |
| 2013/0037818 A1* | 2/2013 | Lee | H01L 27/3258 257/72 |
| 2013/0299790 A1* | 11/2013 | Kang | H01L 51/5203 257/40 |
| 2015/0115234 A1* | 4/2015 | Hong | H01L 51/525 257/40 |
| 2015/0370370 A1* | 12/2015 | Ikeda | G06F 3/044 349/12 |
| 2016/0093644 A1* | 3/2016 | Ki | H01L 29/78672 257/40 |
| 2016/0093685 A1* | 3/2016 | Kwon | H01L 27/3276 257/40 |
| 2016/0172428 A1* | 6/2016 | Song | H01L 27/3276 257/99 |
| 2016/0174304 A1* | 6/2016 | Kim | H05B 33/04 313/511 |
| 2016/0179229 A1* | 6/2016 | Ahn | G06F 3/041 345/173 |
| 2016/0190166 A1* | 6/2016 | Kim | H01L 27/124 257/71 |
| 2017/0124952 A1* | 5/2017 | Zhang | G09G 3/3258 |
| 2017/0371464 A1* | 12/2017 | Nakanishi | G06F 3/0412 |
| 2017/0373128 A1* | 12/2017 | Lee | H01L 27/3258 |
| 2018/0059721 A1* | 3/2018 | Akimoto | G06F 1/1618 |
| 2018/0090553 A1* | 3/2018 | Rieutort-Louis | H01L 27/3218 |

FOREIGN PATENT DOCUMENTS

| | | |
|---|---|---|
| KR | 10-0700653 | 3/2007 |
| KR | 10-2012-0057712 | 6/2012 |

* cited by examiner

DISPLAY DEVICE

CROSS-REFERENCE TO RELATED APPLICATION

This application claims priority from and the benefit of Korean Patent Application No. 10-2016-0119276, filed Sep. 19, 2016, which is hereby incorporated by reference for all purposes as if fully set forth herein.

BACKGROUND

Field

Exemplary embodiments relate to a display device. More particularly, exemplary embodiments relate to a display device that includes a power wire through which a power voltage for driving a plurality of pixels is transmitted.

Discussion of the Background

Liquid crystal displays, organic light emitting diode displays, and the like include a plurality of pixels for displaying an image. The pixels receive a power voltage through a power wire.

The power voltage received through the power wire drops due to resistance of the power wire. Accordingly, pixels disposed close to a power supply may receive a power voltage of a sufficient voltage level, but pixels disposed further away from the power supply may not receive a power voltage of a sufficient voltage level due to a voltage drop. Thus, when image data of the same gray level are inputted to a plurality of pixels, the luminance may deviate from a desired level and vary depending on the position of the pixel. Such a luminance deviation may degrade display quality of the display device.

It is possible to compensate for the voltage drop of the power voltage by increasing the voltage level of the power voltage applied to the power wire. However, in this case, power consumption of the display device may increase.

The above information disclosed in this Background section is only for enhancement of understanding of the background of the inventive concepts, and, therefore, it may contain information that does not form the prior art that is already known in this country to a person of ordinary skill in the art.

SUMMARY

Exemplary embodiments provide a display device that may improve display quality of the display device and reduce power consumption of the display device by reducing a voltage drop of a power voltage for driving a plurality of pixels.

Additional aspects will be set forth in the detailed description which follows, and, in part, will be apparent from the disclosure, or may be learned by practice of the inventive concepts.

Exemplary embodiments provide a display device including: a first substrate; a display area configured to include a plurality of pixels positioned on the first substrate; a pad portion configured to be adjacent to a first side of the display area and to include a plurality of connecting pads positioned on the first substrate; a first common power wire configured to be positioned between the display area and the pad portion and to be connected to a first connecting pad as at least one of the plurality of connecting pads to receive a power voltage; a second common power wire configured to be positioned to be adjacent to a second side of the display area facing the first side; an encapsulation layer configured to be positioned on the display area to protect the plurality of pixels; and a first path wire configured to include one end connected to a second connecting pad of the plurality of connecting pads and the other end connected to the second common power wire and to be positioned on the encapsulation layer.

The display device may further include a touch area configured to include a plurality of touch electrodes positioned on the encapsulation layer and to overlap the display area.

The first path wire may be positioned at the same layer as the plurality of touch electrodes.

The first path wire may extend along a third side of the display area from the pad portion to be connected to the second common power wire.

The other end of the first path wire may overlap the second common power wire.

The second common power wire may extend along the second side of the display area, and may be longer than the second side of the display area.

The first path wire may extend along the second side of the display area on the second common power wire to overlap the second common power wire.

The second common power wire may extend along the second side of the display area, may be shorter than the second side of the display area, and may be positioned to be adjacent to a central portion of the second side of the display area.

The first path wire may extend along the third side of the display area from the pad portion, and may then extend along the second side of the display area to be connected to the second common power wire.

The display device may further include a second path wire configured to include one end connected to a third connecting pad of the plurality of connecting pads and the other end connected to the second common power wire and disposed on the encapsulation layer.

The second path wire may be positioned at the same layer as the plurality of touch electrodes, and may extend along an edge of a fourth side of the display area facing the third side from the pad portion to be connected to the second common power wire.

The other end of the second path wire may overlap the second common power wire.

The second common power wire may extend along the second side of the display area and may be longer than the second side of the display area, and the second path wire may extend along the second side of the display area on the second common power wire to overlap the second common power wire.

The first path wire and the second path wire may be connected to each other.

The first path wire and the second path wire may be positioned at the same layer.

The second common power wire may extend along the second side of the display area, may be shorter than the second side of the display area, and may be positioned to be adjacent to the central portion of the second side of the display area, and the second path wire may extend along the edge of the fourth side of the display area from the pad portion, and may then extend along the second side of the display area to be connected to the second common power wire.

The display device may further include a plurality of power supplying wires configured to respectively include one end connected to the first common power wire and to extend from the first common power wire to the second common power wire in the display area.

At least one of the plurality of power supplying wires may be connected to the second common power wire.

The second common power wire may extend along the second side of the display area and may be longer than the second side of the display area, and the plurality of power supplying wires may be connected to the second common power wire.

The second common power wire may extend along the second side of the display area, may be shorter than the second side of the display area, and may be positioned to be adjacent to the central portion of the second side of the display area, and at least one power supplying wire positioned at the central portion of the second side of the display area of the plurality of power supplying wires may be connected to the second common power wire.

According to the exemplary embodiments of the inventive concepts, it is possible to reduce a voltage drop of a power voltage for driving a plurality of pixels, to improve display quality of a display device, and to reduce power consumption of the display device.

The foregoing general description and the following detailed description are exemplary and explanatory and are intended to provide further explanation of the claimed subject matter.

BRIEF DESCRIPTION OF THE DRAWINGS

The accompanying drawings, which are included to provide a further understanding of the inventive concepts, and are incorporated in and constitute a part of this specification, illustrate exemplary embodiments of the inventive concepts, and, together with the description, serve to explain principles of the inventive concepts.

DETAILED DESCRIPTION OF THE ILLUSTRATED EMBODIMENTS

Figure 1:
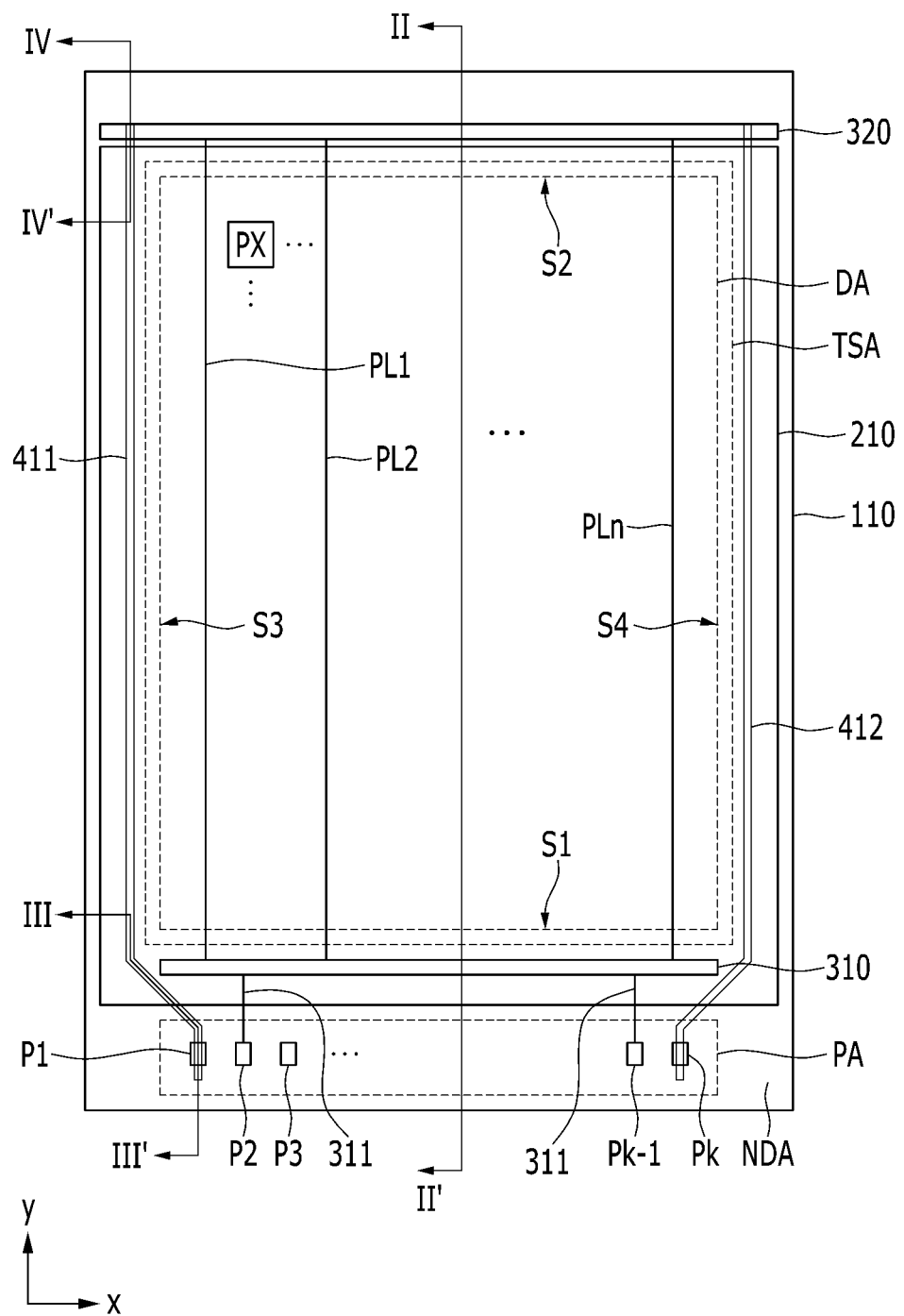
FIG. 1 schematically illustrates a top plan view of a display device according to an exemplary embodiment of the present invention.

In the following description, for the purposes of explanation, numerous specific details are set forth in order to provide a thorough understanding of various exemplary embodiments. It is apparent, however, that various exemplary embodiments may be practiced without these specific details or with one or more equivalent arrangements. In other instances, well-known structures and devices are shown in block diagram form in order to avoid unnecessarily obscuring various exemplary embodiments.

In the accompanying figures, the size and relative sizes of layers, films, panels, regions, etc., may be exaggerated for clarity and descriptive purposes. Also, like reference numerals denote like elements.

When an element or layer is referred to as being "on," "connected to," or "coupled to" another element or layer, it may be directly on, connected to, or coupled to the other element or layer or intervening elements or layers may be present. When, however, an element or layer is referred to as being "directly on," "directly connected to," or "directly coupled to" another element or layer, there are no intervening elements or layers present. For the purposes of this disclosure, "at least one of X, Y, and Z" and "at least one selected from the group consisting of X, Y, and Z" may be construed as X only, Y only, Z only, or any combination of two or more of X, Y, and Z, such as, for instance, XYZ, XYY, YZ, and ZZ. Like numbers refer to like elements throughout. As used herein, the term "and/or" includes any and all combinations of one or more of the associated listed items.

Although the terms first, second, etc. may be used herein to describe various elements, components, regions, layers, and/or sections, these elements, components, regions, layers, and/or sections should not be limited by these terms. These terms are used to distinguish one element, component, region, layer, and/or section from another element, component, region, layer, and/or section. Thus, a first element, component, region, layer, and/or section discussed below could be termed a second element, component, region, layer, and/or section without departing from the teachings of the present disclosure.

Spatially relative terms, such as "beneath," "below," "lower," "above," "upper," and the like, may be used herein for descriptive purposes, and, thereby, to describe one element or feature's relationship to another element(s) or feature(s) as illustrated in the drawings. Spatially relative terms are intended to encompass different orientations of an apparatus in use, operation, and/or manufacture in addition to the orientation depicted in the drawings. For example, if the apparatus in the drawings is turned over, elements described as "below" or "beneath" other elements or features would then be oriented "above" the other elements or features. Thus, the exemplary term "below" can encompass both an orientation of above and below. Furthermore, the apparatus may be otherwise oriented (e.g., rotated 90 degrees or at other orientations), and, as such, the spatially relative descriptors used herein interpreted accordingly.

The terminology used herein is for the purpose of describing particular embodiments and is not intended to be limiting. As used herein, the singular forms, "a," "an," and "the" are intended to include the plural forms as well, unless the context clearly indicates otherwise. Moreover, the terms "comprises," "comprising," "includes," and/or "including," when used in this specification, specify the presence of stated features, integers, steps, operations, elements, components, and/or groups thereof, but do not preclude the presence or addition of one or more other features, integers, steps, operations, elements, components, and/or groups thereof.

Various exemplary embodiments are described herein with reference to sectional illustrations that are schematic illustrations of idealized exemplary embodiments and/or intermediate structures. As such, variations from the shapes of the illustrations as a result, for example, of manufacturing techniques and/or tolerances, are to be expected. Thus, exemplary embodiments disclosed herein should not be construed as limited to the particular illustrated shapes of regions, but are to include deviations in shapes that result from, for instance, manufacturing. As such, the regions illustrated in the drawings are schematic in nature and their shapes are not intended to illustrate the actual shape of a region of a device and are not intended to be limiting.

Unless otherwise defined, all terms (including technical and scientific terms) used herein have the same meaning as commonly understood by one of ordinary skill in the art to which this disclosure is a part. Terms, such as those defined in commonly used dictionaries, should be interpreted as having a meaning that is consistent with their meaning in the context of the relevant art and will not be interpreted in an idealized or overly formal sense, unless expressly so defined herein.

Figure 2:
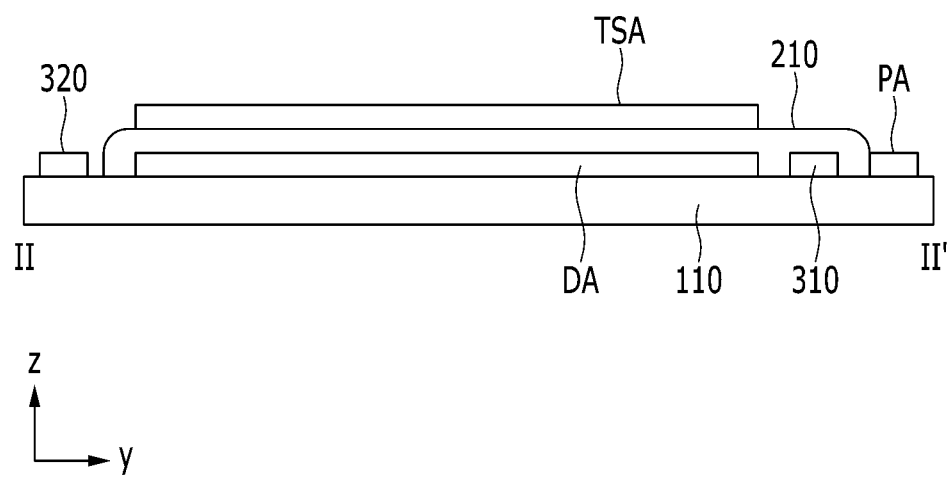
FIG. 2 illustrates a cross-sectional view taken along line II-II' of FIG. 1.
Figure 3:
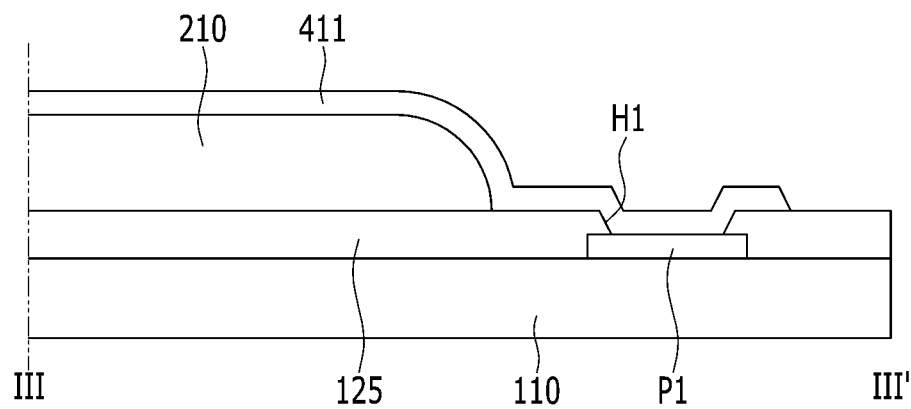
FIG. 3 illustrates a cross-sectional view taken along line III-III' of FIG. 1.
Figure 4:
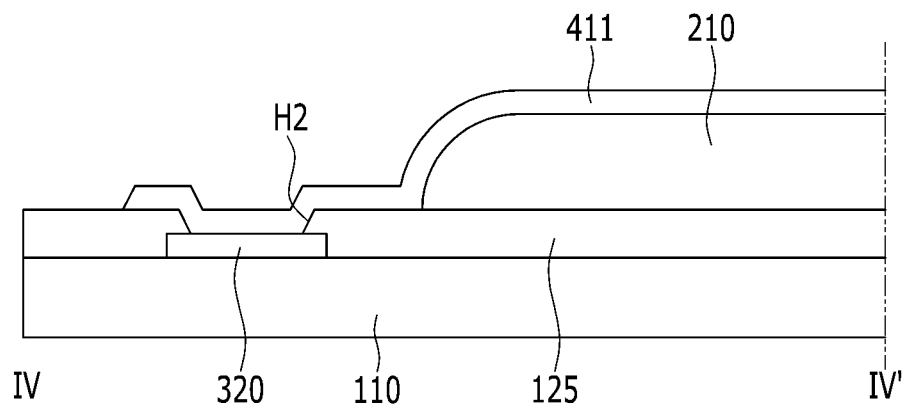
FIG. 4 illustrates a cross-sectional view taken along line IV-IV' of FIG. 1.

FIG. 1 schematically illustrates a top plan view of a display device according to an exemplary embodiment. FIG. 2 illustrates a cross-sectional view taken along line II-II' of FIG. 1. FIG. 3 illustrates a cross-sectional view taken along line III-III' of FIG. 1. FIG. 4 illustrates a cross-sectional view taken along line IV-IV' of FIG. 1.

Referring to FIG. 1, FIG. 2, FIG. 3, and FIG. 4, a display device includes a first substrate 110, a display area DA, a pad portion PA, an encapsulation layer 210, a first common power wire 310, a second common power wire 320, a touch sensor area TSA, a first path wire 411, and a second path wire 412.

The display area DA includes a plurality of pixels PX positioned on the first substrate 110. The first substrate 110 may be a transparent insulator made of plastic or glass. An area in which the plurality of pixels PX are positioned is referred to as a display area, and the display area corresponds to the display area DA. A peripheral area of display area is referred to as a non-display area NDA.

Pixels having various structures may be included in the display area DA. For example, when the display device is an organic light emitting diode display, each of a plurality of pixels PX included in the display area DA may include at least one thin film transistor, an anode connected to the at least one thin film transistor, a cathode corresponding to the anode, and an organic emission layer positioned between the anode and the cathode. Alternatively, when the display device is a liquid crystal display, each of a plurality of pixels PX included in the display area DA may include at least one thin film transistor, a pixel electrode connected to the at least one thin film transistor, a common electrode corresponding to the pixel electrode, a liquid crystal layer positioned between the pixel electrode and the common electrode, and a color filter. Hereinafter, a display device according to the present exemplary embodiment in the form of an organic light emitting diode display will be described herein for purposes of illustration. The display area DA of the organic light emitting diode display will be described later in detail with reference to FIG. 5 and FIG. 6.

The pad portion PA includes a plurality of connecting pads P1-Pk positioned on the first substrate 110. The plurality of connecting pads P1-Pk are adjacent to a first side S1 of the display area DA. The plurality of connecting pads P1-Pk may be arranged in a first direction x along the first side S1 of the display area DA. That is, the pad portion PA may be positioned to be adjacent to the first side S1 of the display area DA. The pad portion PA may be connected to a flexible printed circuit board (FPCB, not shown), and may receive a first power voltage generated in an external power supply through the flexible printed circuit board (FPCB).

The first common power wire 310 is positioned between the display area DA and the pad portion PA. The first common power wire 310 may extend in the first direction x between the display area DA and the pad portion PA. The first common power wire 310 may have the same length as or a similar length to the first side S1 of the display area DA.

The first common power wire 310 may be connected to at least one of the plurality of connecting pads P1-Pk to receive the first power voltage. For example, as shown in FIG. 1, the first common power wire 310 may be connected to a leftmost second one P2 and a rightmost second one Pk-1 of the plurality of connecting pads P1-Pk through a power connecting wire 311. The first common power wire 310 may receive the first power voltage through the connecting pads P2, Pk-1 connected thereto through the power connecting wire 311.

The second common power wire 320 is positioned to be adjacent to a second side S2 of the display area DA facing the first side S1 of the display area DA to which the first common power wire 310 is adjacent. That is, the first common power wire 310 and the second common power wire 320 may face each other with the display area DA therebetween. The second common power wire 320 may be adjacent to the second side S2 of the display area DA, and may extend in the first direction x along the second side S2. The second common power wire 320 may be longer than a length of the second side S2 of the display area DA. That is, opposite ends of the second common power wire 320 may protrude over the second side S2 of the display area DA in the first direction x.

The encapsulation layer 210 is positioned on the display area DA. The encapsulation layer 210 covers the display area DA to protect a plurality of pixels PX from the outside and to seal an internal space thereof. The encapsulation layer 210 may be formed with alternately stacked inorganic layers and organic layers. The inorganic layer is thin, but it is dense, and thus it can function as a barrier to moisture, oxygen, and the like. The organic layer acts for flattening, and it can reduce stress of the inorganic layer. The inorganic layer may be made of a material selected from a silicon oxide, a silicon nitride, a silicon oxynitride, an aluminum oxide, an aluminum nitride, an aluminum oxynitride, a titanium oxide, a titanium nitride, a tantalum oxide, a tantalum nitride, a hafnium oxide, a hafnium nitride, a zirconium oxide, a zirconium nitride, a cerium oxide, a cerium nitride, a tin oxide, a tin nitride, and a magnesium oxide. The organic layer may be made of an acryl-based resin, a methacrylate-based resin, an isoprene-based resin, a vinyl-based resin, an epoxy-based resin, a urethane-based resin, a cellulose-based resin, a perylene-based resin, an imide-based resin, or a mixture of two or more thereof.

According to exemplary embodiments, the encapsulation layer 210 may be formed of an encapsulation member such as transparent glass or plastic, and the encapsulation member may be bonded to the first substrate 110 by a sealant (not shown), and seal the internal space thereof.

The encapsulation layer 210 may cover the first common power wire 310, and may not cover the pad portion PA and the second common power wire 320. The encapsulation layer 210 may be positioned from a place between the first common power wire 310 and the pad portion PA to a place between the second common power wire 320 and the display area DA in a second direction y crossing the first direction x. In addition, the encapsulation layer 210 may be positioned from the outside of a third side S3 of the display area DA to the outside of a fourth side S4 thereof in the first direction x. That is, the encapsulation layer 210 may be wider than the display area DA.

The touch sensor area TSA is positioned on the encapsulation layer 210. The touch sensor area TSA may have the same area as or a similar area to the display area DA, and may overlap the display area DA. The touch sensor area TSA will be described later more fully with reference to FIG. 7 to FIG. 14.

The first path wire 411 includes one end connected to one of the plurality of connecting pads P1-Pk and the other end connected to the second common power wire 320. The second path wire 412 includes one end connected to another of the plurality of connecting pads P1-Pk and the other end connected to the second common power wire 320. That is, the first path wire 411 connects one of the plurality of connecting pads P1-Pk and the second common power wire 320 to each other, and the second path wire 412 connects another of the plurality of connecting pads P1-Pk and the second common power wire 320 to each other.

As shown in FIG. 1, the first path wire 411 may be connected to a leftmost one P1 of the plurality of connecting pads P1-Pk. The second path wire 412 may be connected to a rightmost one Pk of the plurality of connecting pads P1-Pk. The first path wire 411 may extend in the second direction y from the leftmost connecting pad P1 along the third side S3 of the display area DA. The second path wire 412 may extend in the second direction y from the rightmost connecting pad Pk along the fourth side S4 of the display area DA.

In this case, the first path wire 411 and the second path wire 412 may not overlap the display area DA. In addition, the first path wire 411 and the second path wire 412 may not overlap the touch sensor area TSA. The first path wire 411 and the second path wire 412 are positioned on the encapsulation layer 210, and may be positioned at the same layer as the touch sensor area TSA positioned on the encapsulation layer 210. Further, the first path wire 411 and the second path wire 412 may be positioned at the same layer on the encapsulation layer 210.

As shown in FIG. 3, the connecting pad P1 may be positioned on the first substrate 110, and an insulating layer 125 may be positioned on the first substrate 110 and the connecting pad P1. The insulating layer 125 may be formed as a single layer made of a silicon nitride or a dual layer in which a silicon nitride and a silicon oxide are stacked. The insulating layer 125 may include a first contact hole H1 exposing connecting pad P1. One end of the first path wire 411 positioned on the encapsulation layer 210 may overlap and contact the connecting pad P1 through the first contact hole H1.

A configuration in which the one end of the second path wire 412 contacts the connecting pad Pk is the same as that in which the one end of the first path wire 411 illustrated in FIG. 3 contacts the connecting pad P1, so a detailed description thereof will be omitted.

As shown in FIG. 4, the second common power wire 320 may be positioned on the first substrate 110, and the insulating layer 125 may be positioned on the first substrate 110 and the second common power wire 320. The insulating layer 125 may include a second contact hole H2 positioned at a portion at which the first path wire 411 and the second common power wire 320 overlap. The second contact hole H2 may overlap some of the second common power wire 320. The other end of the first path wire 411 positioned on the encapsulation layer 210 may overlap and contact the second common power wire 320 through the second contact hole H2.

A configuration in which the other end of the second path wire 412 contacts the second common power wire 320 is the same as that in which the other end of the first path wire 411 illustrated in FIG. 4 contacts the second common power wire 320, so a detailed description thereof will be omitted.

The first power voltage is applied to the connecting pad P1 connected to the first path wire 411 and the connecting pad P1 connected to the second path wire 412 through a flexible printed circuit board (FPCB). The first power voltage is applied to the second common power wire 320 through the first path wire 411 and the second path wire 412. Accordingly, the first common power wire 310 and the second common power wire 320 may receive the same first power voltage.

The display area DA includes a plurality of power supplying wires PL1-PLn. Each of the plurality of power supplying wires PL1-PLn includes one end connected to the first common power wire 310 and the other end connected to the second common power wire 320. That is, each of the plurality of power supplying wires PL1-PLn is connected to the first common power wire 310 and the second common power wire 320. The plurality of power supplying wires PL1-PLn receive the first power voltage from the first common power wire 310 and the second common power wire 320. The plurality of pixels PX are connected to the plurality of power supplying wires PL1-PLn, and the plurality of pixels PX may receive the first power voltage through the plurality of power supplying wires PL1-PLn.

As described above, as the first power voltage is applied to the plurality of power supplying wires PL1-PLn through the second common power wire 320 of the second side S2 of the display area DA facing the first side S1 in addition to the first common power wire 310 adjacent to the first side S1 of the display area DA, it is possible to reduce the voltage drop of the first power voltage in which the voltage level of the first power voltage is dropped farther away from the pad portion PA, and it is possible to improve display quality by improving luminance uniformity between the plurality of pixels PX.

Hereinafter, the display area DA according the exemplary embodiment will be described more fully with reference to FIGS. 5 and 6.

Figure 5:
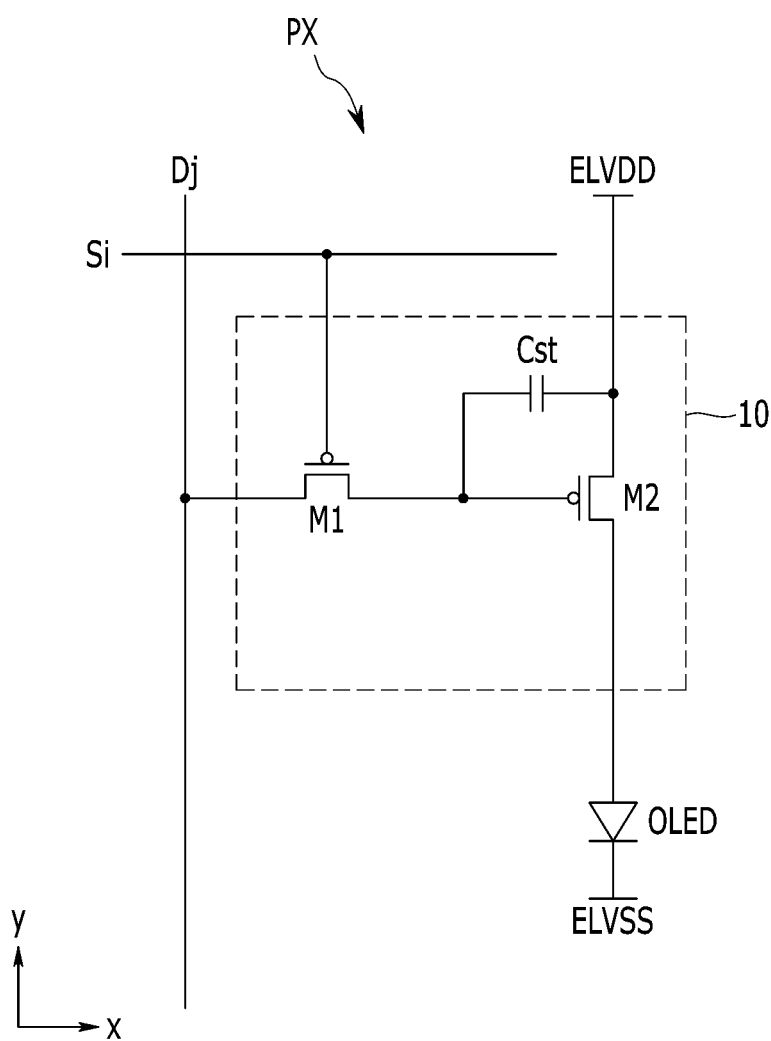
FIG. 5 illustrates a circuit diagram of a pixel included in the display device of FIG. 1.

FIG. 5 illustrates a circuit diagram of a pixel included in the display device of FIG. 1.

Referring to FIG. 5, each of the plurality of pixels PX includes an organic light emitting diode (OLED) and a pixel circuit 10 for driving the OLED. The pixel circuit 10 includes a switching transistor M1, a driving transistor M2, and a storage capacitor Cst.

The switching transistor M1 includes a gate electrode connected to a gate line Si, one terminal connected to a data line Dj, and the other terminal connected to a gate electrode of the driving transistor M2.

The driving transistor M2 includes a gate electrode connected to the other terminal of the switching transistor M1, one terminal connected to the first power voltage (ELVDD), and the other terminal connected to the OLED.

The storage capacitor Cst includes one electrode connected to the gate electrode of the driving transistor M2 and the other electrode connected to the first power voltage (ELVDD). The storage capacitor Cst charges a data voltage applied to the gate electrode of the driving transistor M2, and maintains the charged data voltage even after the switching transistor M1 is turned off.

The OLED includes an anode connected to the other terminal of the driving transistor M2 and a cathode connected to a second power voltage (ELVSS).

The switching transistor M1 and the driving transistor M2 may be a p-channel field effect transistors. In this case, a gate-on voltage turning on the switching transistor M1 and the driving transistor M2 is a low level voltage, and a gate-off voltage turning them off is a high level voltage.

In the present exemplary embodiment, the p-channel field effect transistor is shown, but at least one of the switching transistor M1 and the driving transistor M2 may be an n-channel field effect transistor. In this case, a gate-on voltage turning on the n-channel field effect transistor is a high level voltage, and a gate-off voltage turning it off is a low level voltage.

When the gate-on voltage is applied to the gate line Si, the switching transistor M1 is turned on, and the data signal applied to the data line Dj is applied to one terminal of the storage capacitor Cst through the turned-on switching transistor M1 and charges the storage capacitor Cst. The driving transistor M2 controls an amount of current flowing from the first power voltage (ELVDD) to the OLED, corresponding to the voltage charged in the storage capacitor Cst. The OLED emits light corresponding to an amount of current flowing through the driving transistor M2.

The OLED may emit light corresponding to one of primary colors. The primary colors may be three primary colors such as red, green, and blue, and a desired color is displayed by a spatial or temporal sum of the three primary colors. The primary colors according to the exemplary embodiment may be yellow, cyan, magenta, etc., and the OLED may emit light of one of yellow, cyan, and magenta. The primary colors may consist of combinations of various colors.

In an exemplary embodiment, one OLED may emit light of white, thereby improving luminance. Alternatively, the OLEDs of all of the pixels PX may emit light of white, and some of the pixels PX may further include a color filter (not shown) that converts the light of white emitted from the OLEDs into one of the primary colors.

The pixel circuit 10 shown in FIG. 5 is an exemplary embodiment that controls emission of the OLED depending on the gate signal applied to the gate line Si and the data signal applied to the data line Dj. The pixel circuit 10 controlling the emission of the OLED by using the gate signal and the data signal may be implemented in various kinds of known pixel circuits.

Figure 6:
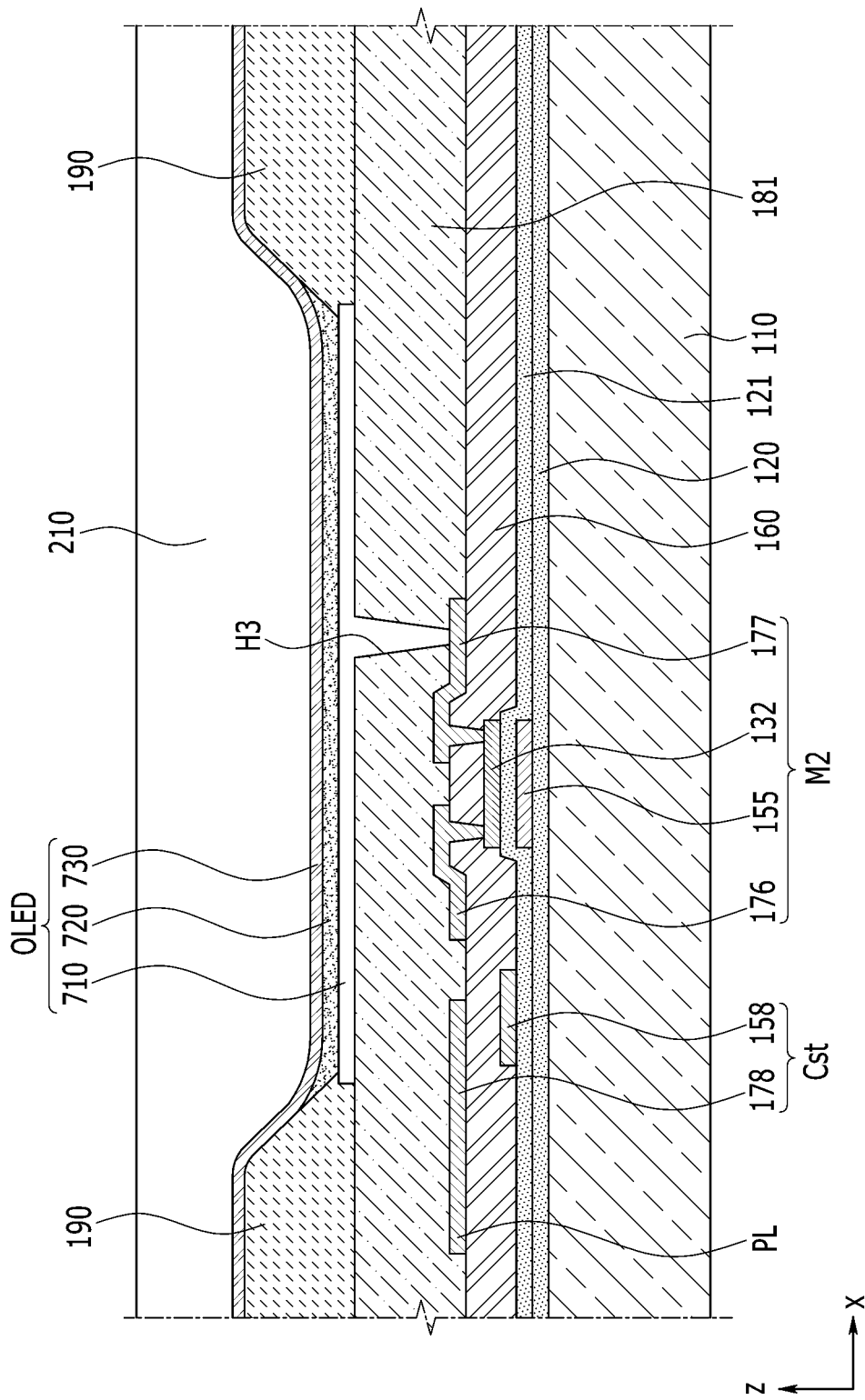
FIG. 6 illustrates a cross-sectional view of a display area of the display device of FIG. 1.

FIG. 6 illustrates a cross-sectional view of a display area of the display device of FIG. 1. FIG. 6 illustrates a cross-section of the driving transistor M2, the storage capacitor Cst, and the OLED included in one pixel PX.

Referring to FIG. 6, a buffer layer 120 is positioned on the first substrate 110. The buffer layer 120 plays a role of preventing penetration of undesired components, such as impure elements or moisture, while flattening the surface thereof. However, the buffer layer 120 is not necessarily required, and may be omitted depending on the kind and processing conditions of the first substrate 110.

A gate electrode 155 is positioned on the buffer layer 120. A first insulating layer 121 is positioned on the gate electrode 155 and the buffer layer 120. A semiconductor layer 132 made of amorphous silicon, polysilicon, etc. is positioned on the first insulating layer 121. The semiconductor layer 132 overlaps the gate electrode 155. The first insulating layer 121 may be formed as a single layer made of a silicon nitride, or a dual layer in which a silicon nitride and a silicon oxide are stacked. One electrode 158 of the storage capacitor Cst may be positioned on the first insulating layer 121. A second insulating layer 160 is positioned on the semiconductor layer 132, the one electrode 158 of the storage capacitor Cst, and the exposed first insulating layer 121. A source electrode 176 and a drain electrode 177 facing each other are positioned on the second insulating layer 160. The source electrode 176 may be connected to one end of the semiconductor layer 132 through one contact hole passing through the second insulating layer 160, and the drain electrode 177 may be connected to the other end the semiconductor layer 132 through another contact hole passing through the second insulating layer 160. The gate electrode 155, the source electrode 176, the drain electrode 177, and the semiconductor layer 132 form a thin film transistor (TFT), that is, the driving transistor M2. A channel of the driving transistor M2 is formed in the semiconductor layer 132 between the source electrode 176 and the drain electrode 177.

A power supplying line PL of the first power voltage (ELVDD) is positioned on the second insulating layer 160. The storage capacitor Cst includes the one electrode 158 and another electrode 178 disposed with the second insulating layer 160 therebetween. Some of the power supplying line PL of the first power voltage (ELVDD) may be the other electrode 178 of the storage capacitor Cst. Herein, the second insulating layer 160 becomes a dielectric material of the storage capacitor Cst.

An organic layer 181 is positioned on the driving transistor M2 and the storage capacitor Cst. A pixel electrode 710 is positioned on the organic layer 181, and the pixel electrode 710 is connected to the drain electrode 177 of the driving transistor M2 through a third contact hole H3 passing through the organic layer 181. An organic emission layer 720 is positioned on the pixel electrode 710, and a power electrode 730 of the second power voltage (ELVSS) is positioned on the organic emission layer 720. The power electrode 730 may include a transparent conductor such as ITO, IZO, etc. The pixel electrode 710, the organic emission layer 720, and the power electrode 730 form an organic light emitting element (OLED). The pixel electrode 710 may be an anode of the OLED, and the power electrode 730 may be a cathode of the OLED. Holes and electrons from the pixel electrode 710 and the power electrode 730 are injected into the organic emission layer 720, and light is emitted when excitons in which the injected holes and electrons are combined drop from an excited state to a ground state.

A pixel defining layer 190 defining an area of the OLED may be positioned around the pixel electrode 710. The encapsulation layer 210 for protecting the OLED may be positioned on the OLED.

Since the above-described structures of the driving transistor M2 and the OLED are only exemplary embodiments, the present disclosure is not limited thereto, and various known structures of the thin film transistors and the OLED may be used.

Hereinafter, the touch sensor area TSA included in the display device according to an exemplary embodiment will be described with reference to FIG. 7 and FIG. 8.

Figure 7:
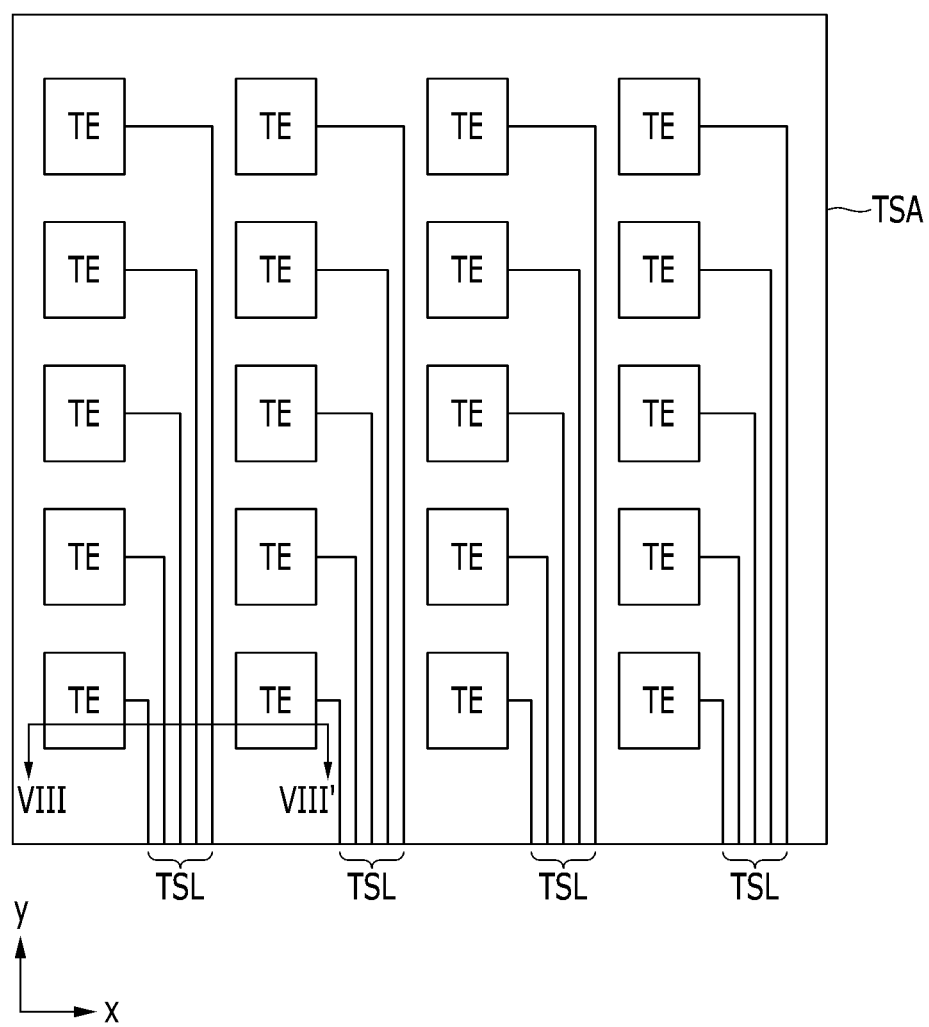
FIG. 7 illustrates a top plan view of one example of a touch sensor area of the display device of FIG. 1.

FIG. 7 illustrates a top plan view of one example of the touch sensor area of the display device of FIG. 1. FIG. 8 illustrates a cross-sectional view taken along line VIII-VIII' of FIG. 7.

Figure 8:
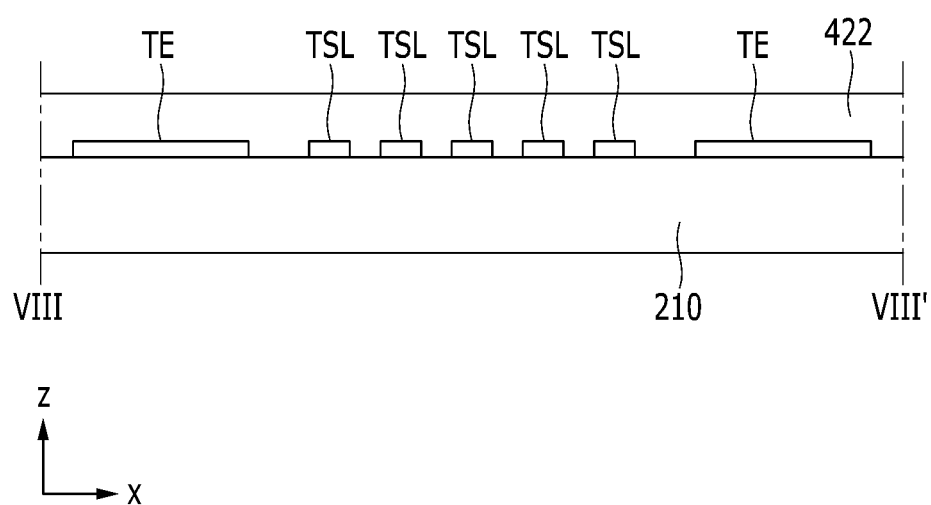
FIG. 8 illustrates a cross-sectional view taken along line VIII-VIII' of FIG. 7.

Referring to FIG. 7 and FIG. 8, the touch sensor area TSA according to an exemplary embodiment includes a plurality of touch electrodes TE and a plurality of touch sensing lines TSL.

The plurality of touch electrodes TE may be positioned directly on the encapsulation layer 210. In this case, the first path wire 411 and the second path wire 412 described in FIG. 1 to FIG. 4 may be positioned directly on the encapsulation layer 210, and the first path wire 411 and the second path wire 412 may be positioned at the same layer as the plurality of touch electrodes TE.

The plurality of touch electrodes TE are arranged in the first direction x and the second direction y. The first direction x may be a row direction, and the second direction y may be a column direction. That is, the plurality of touch electrodes TE are arranged on the encapsulation layer 210 to have a matrix form.

Each of the plurality of touch electrodes TE may have a quadrangular shape. Herein, it is exemplarily described that each of the plurality of touch electrodes TE has a quadrangular shape, but each of the plurality of touch electrodes TE may have various shape such a triangular shape, a hexagonal shape, a particular polygonal shape, etc.

The plurality of touch electrodes TE may include an electrically conductive transparent material such as indium tin oxide (ITO), indium zinc oxide (IZO), etc. The plurality of touch electrodes TE may have a metal mesh shape. The metal mesh may be formed to have a metal fine pattern with high electrical conductivity. The metal fine pattern forming the metal mesh may include a metal material such as Ag, Au, Pt, Cu, Mo, Al, etc., and it may have a line width of about 0.1 um to about 10 um. The plurality of touch electrodes TE formed as the metal mesh may have high electrical conductivity and high transparency.

The plurality of touch sensing lines TSL are positioned directly on the encapsulation layer 210. That is, the plurality of touch sensing lines TSL are positioned at the same layer as the plurality of touch electrodes TE. The plurality of touch sensing lines TSL may be provided with the same number as that of the plurality of touch electrodes TE. The plurality of touch sensing lines TSL are respectively connected to the plurality of touch electrodes TE. The plurality of touch sensing lines TSL may substantially extend in the second direction y from the plurality of touch electrodes TE to be connected to the pad portion PA described in FIG. 1.

The plurality of touch sensing lines TSL may include a metal material with excellent electrical conductivity. The metal material with excellent electrical conductivity may be Ag, Au, Pt, Cu, Mo, Al, etc. The plurality of touch sensing lines TSL may have a metal mesh shape. The plurality of touch sensing lines TSL may include an electrically conductive transparent material such as indium tin oxide (ITO), indium zinc oxide (IZO), etc.

An interlayer insulating layer 422 may be positioned on the plurality of touch electrodes TE and the plurality of touch sensing lines TSL. The interlayer insulating layer 422 may include at least one of an organic insulating material and an inorganic insulating material. The interlayer insulating layer 422 may insulate and protect the plurality of touch electrodes TE and the plurality of touch sensing lines TSL from the outside.

When an external object such as a finger of a user approaches at least one of the plurality of touch electrodes TE, a capacitance may be generated between the external object and the touch electrode TE, and the capacitance of the touch electrode TE may be transmitted to a touch controller (not shown) through the touch sensing line TSL and the pad portion PA connected to the touch electrode TE. The touch controller may be positioned in the flexible printed circuit board (FPCB) connected to the pad portion PA. The touch controller may sense a touch position by checking the touch electrode TE in which the capacitance is changed.

Hereinafter, another example of the touch sensor area TSA included in the display device according to the exemplary embodiment will be described with reference to FIG. 9 and FIG. 10.

Figure 9:
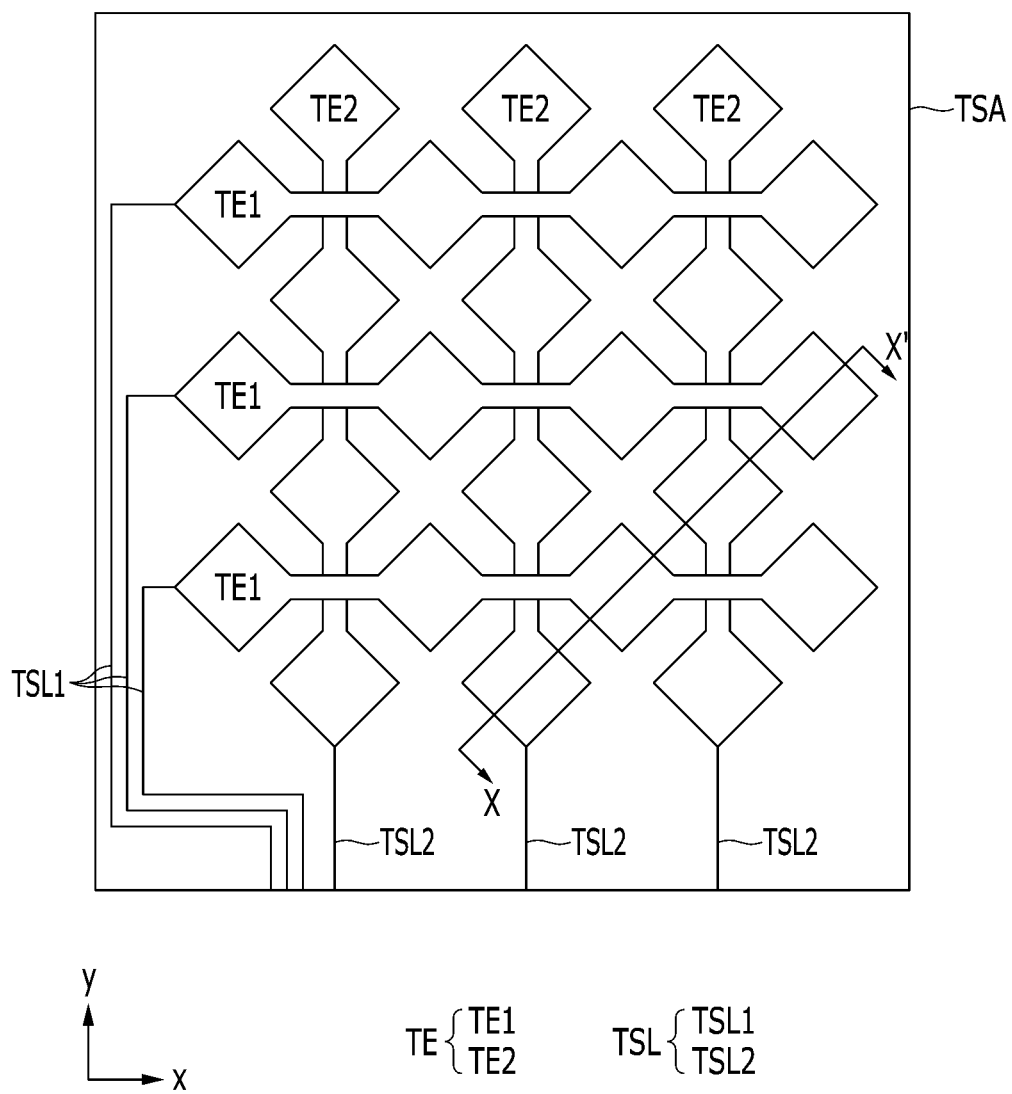
FIG. 9 illustrates a top plan view of another example of a touch sensor area of the display device of FIG. 1.

FIG. 9 illustrates a top plan view of another example of the touch sensor area of the display device of FIG. 1. FIG. 10 illustrates a cross-sectional view taken along line X-X' of FIG. 9.

Figure 10:
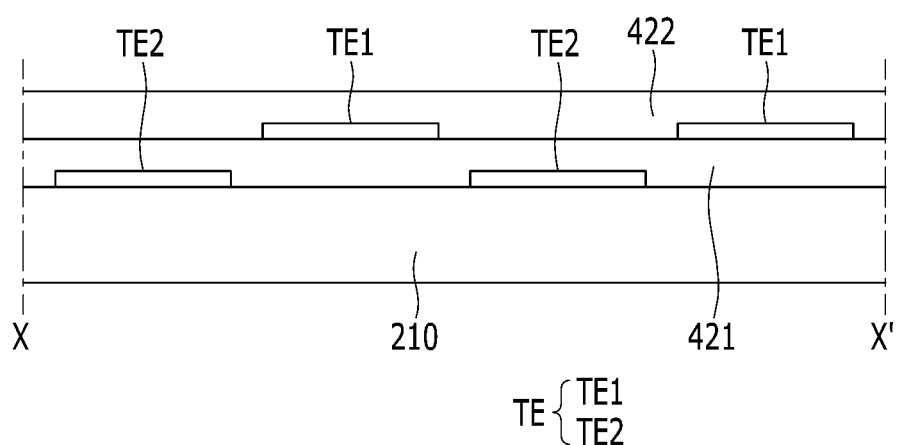
FIG. 10 illustrates a cross-sectional view taken along line X-X' of FIG. 9.

Referring to FIG. 9 and FIG. 10, the touch sensor area TSA according to another exemplary embodiment includes the plurality of touch electrodes TE and the plurality of touch sensing lines TSL, the plurality of touch electrodes TE include a plurality of first touch electrodes TE1 and a plurality of second touch electrodes TE2, and the plurality of touch sensing lines TSL include a plurality of first touch sensing lines TSL1 and a plurality of second touch sensing lines TSL2.

The plurality of first touch electrodes TE1 extend on the encapsulation layer 210 in the first direction x, and are positioned to be parallel to each other. The plurality of second touch electrodes TE2 extend on the encapsulation layer 210 in the second direction y, and are positioned to be parallel to each other. The plurality of first touch electrodes TE1 and the plurality of second touch electrodes TE2 cross each other to be partially overlapped.

A touch insulating layer 421 is positioned between the plurality of first touch electrodes TE1 and the plurality of second touch electrodes TE2. The plurality of first touch electrodes TE1 and the plurality of second touch electrodes TE2 are insulated from each other by the touch insulating layer 421. The touch insulating layer 421 may include at least one of an organic insulating material and an inorganic insulating material.

One of the plurality of first touch electrodes TE1 and the plurality of second touch electrodes TE2 may be positioned directly on the encapsulation layer 210, and the other thereof may be positioned on the touch insulating layer 421. That is, the plurality of first touch electrodes TE1 and the plurality of second touch electrodes TE2 may be positioned on different layers. Herein, it will be exemplarily described that the plurality of second touch electrodes TE2 are positioned directly on the encapsulation layer 210 and the plurality of first touch electrodes TE1 are positioned on the touch insulating layer 421. The interlayer insulating layer 422 is positioned on the plurality of first touch electrodes TE1. In this case, the first path wire 411 and the second path wire 412 described in FIG. 1 to FIG. 4 may be positioned directly on the encapsulation layer 210, and the first path wire 411 and the second path wire 412 may be positioned at the same layer as the plurality of second touch electrodes TE2. Alternatively, the first path wire 411 and the second path wire 412 may be positioned on the touch insulating layer 421, and the first path wire 411 and the second path wire 412 may be positioned at the same layer as the plurality of first touch electrodes TE1.

The plurality of first touch electrodes TE1 may include a plurality of expansion portions expanded in portions which do not overlap the plurality of second touch electrodes TE2, respectively. In addition, the plurality of second touch electrodes TE2 may include a plurality of expansion portions expanded in portions which do not overlap the plurality of first touch electrodes TEL The expansion portions of the first touch electrode TE1 and the second touch electrode TE2 may have a rhombus shape, and the expansion portion of the first touch electrode TE1 and the expansion portion of the second touch electrode TE2 do not overlap each other. The expansion portion of the first touch electrode TE1 and the expansion portion of the second touch electrode TE2 may generate a capacitance. Herein, it is exemplified that the expansion portion of the first touch electrode TE1 and the expansion portion of the second touch electrode TE2 have the rhombus shape, but they may have various shapes such as a circular shape, a polygonal shape, etc.

The plurality of first touch electrodes TE1 and the plurality of second touch electrodes TE2 may include an electrically conductive transparent material such as indium tin oxide (ITO), indium zinc oxide (IZO), etc. The plurality of first touch electrodes TE1 and the plurality of second touch electrodes TE2 may have a metal mesh shape.

Each of the plurality of first touch sensing lines TSL1 may include one end connected to each of the plurality of first touch electrodes TE1 and the other end connected to the pad portion PA described in FIG. 1. That is, the plurality of first touch electrodes TE1 may be connected to the touch controller (not shown) through the plurality of first touch sensing lines TSL1 and the pad portion PA.

Each of the plurality of second touch sensing lines TSL2 may include one end connected to each of the plurality of second touch electrodes TE2 and the other end connected to the pad portion PA. That is, the plurality of second touch electrodes TE2 may be connected to the touch controller through the plurality of second touch sensing lines TSL2 and the pad portion PA.

The touch controller sequentially applies a touch detection signal to the plurality of second touch sensing lines TSL2. When an external object such as a finger of a user approaches one of the plurality of first touch electrodes TE1 and one of the plurality of second touch electrodes TE2, a capacitance between the first touch electrode TE1 and the second touch electrode TE2 is changed. The touch controller may sense a touch position by checking change of the capacitance through the plurality of first touch sensing lines TSL1.

Hereinafter, another example of the touch sensor area TSA included in the display device according to the exemplary embodiment will be described with reference to FIG. 11 and FIG. 12.

Figure 11:
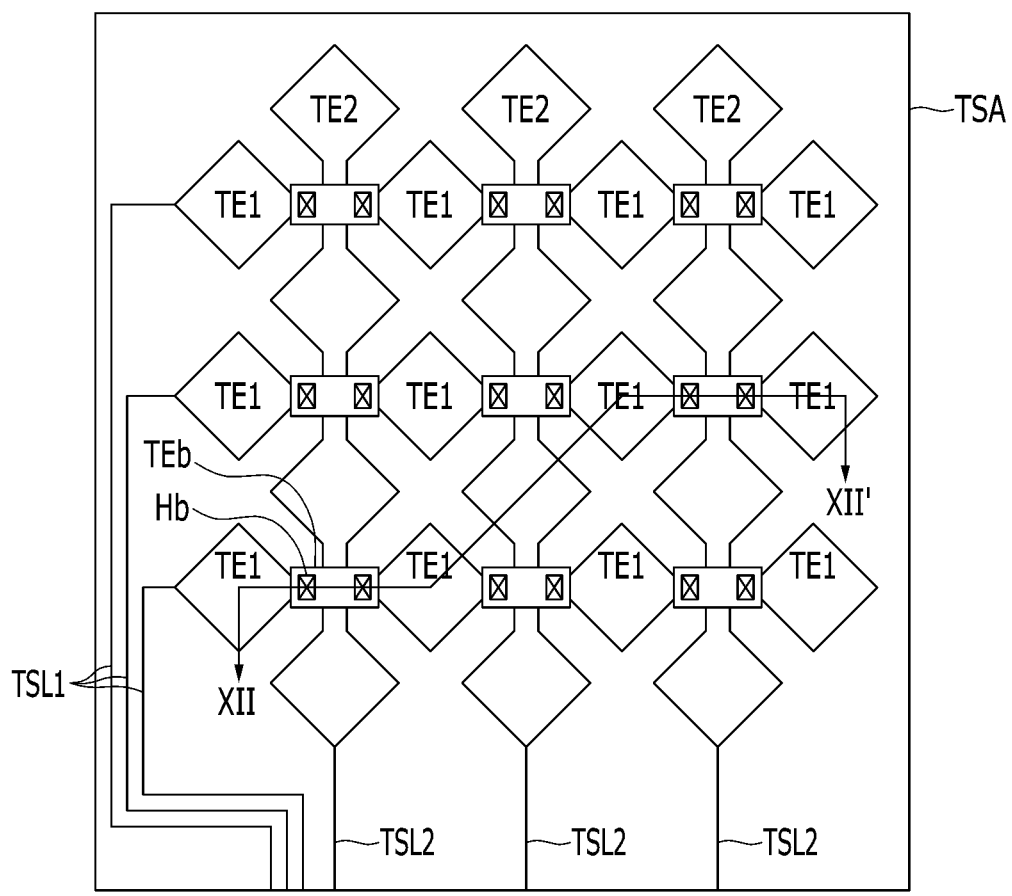
FIG. 11 illustrates a top plan view of another example of a touch sensor area of the display device of FIG. 1.

FIG. 11 illustrates a top plan view of another example of the touch sensor area of the display device of FIG. 1. FIG. 12 illustrates a cross-sectional view taken along line XII-XII' of FIG. 11.

Figure 12:
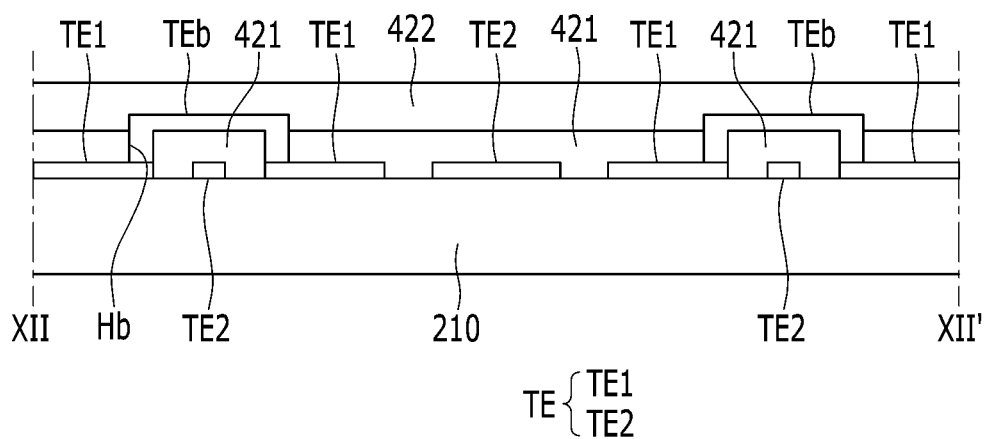
FIG. 12 illustrates a cross-sectional view taken along line XII-XII' of FIG. 11.

Referring to FIG. 11 and FIG. 12, the touch sensor area TSA according to another exemplary embodiment includes the plurality of touch electrodes TE and the plurality of touch sensing lines TSL, the plurality of touch electrodes TE include the plurality of first touch electrodes TE1 and the plurality of second touch electrodes TE2, and the plurality of touch sensing lines TSL include the plurality of first touch sensing lines TSL1 and the plurality of second touch sensing lines TSL2.

The plurality of first touch electrodes TE1 are arranged on the encapsulation layer 210 in the first direction x and the second direction y. That is, the plurality of first touch electrodes TE1 may be arranged in a matrix form on the encapsulation layer 210. The plurality of second touch electrodes TE2 extend in the second direction y on the encapsulation layer 210, and are positioned to be parallel to each other. The plurality of first touch electrodes TE1 and the plurality of second touch electrodes TE2 are positioned directly on the encapsulation layer 210, and they may not overlap each other. That is, the plurality of first touch electrodes TE1 and the plurality of second touch electrodes TE2 may be positioned at the same layer. The touch insulating layer 421 may be positioned on the plurality of first touch electrodes TE1 and the plurality of second touch electrodes TE2. In this case, the first path wire 411 and the second path wire 412 described in FIG. 1 to FIG. 4 may be positioned directly on the encapsulation layer 210, and the first path wire 411 and the second path wire 412 may be positioned at the same layer as the plurality of first touch electrodes TE1 and the plurality of second touch electrodes TE2.

Each of the plurality of first touch electrodes TE1 may have a rhombus shape. The plurality of second touch electrodes TE2 may include a plurality of expansion portions of a rhombus shape expanded in portions which do not overlap the plurality of first touch electrodes TE1, respectively. The first touch electrode TE1 and the expansion portion of the second touch electrode TE2 adjacent thereto may generate a capacitance. Herein, it is exemplified that the first touch electrode TE1 and the expansion portion of the second touch electrode TE2 have the rhombus shapes, but they may have various shapes such as a circular shape, a polygonal shape, etc.

Some of the plurality of first touch electrodes TE1 positioned at the same row may be connected to each other by a plurality of touch electrode bridges TEb. The touch insulating layer 421 is provided with a plurality of contact holes Hb exposing the plurality of first touch electrodes TE1, and the touch electrode bridge TEb may connect one first touch electrode TE1 and another first touch electrode TE1 adjacent thereto in the first direction x to each other through the contact hole Hb. The plurality of first touch electrodes TE1 positioned at the same row by the touch electrode bridge TEb may form one row line touch electrode. That is, the plurality of first touch electrodes TE1 and the plurality of touch electrode bridges TEb may form a plurality of row line touch electrodes.

The touch electrode bridge TEb may cross and overlap the second touch electrode TE2 with the touch insulating layer 421 therebetween. The interlayer insulating layer 422 is positioned on the touch insulating layer 421 and the touch electrode bridge TEb.

The plurality of first touch electrodes TE1, the plurality of second touch electrodes TE2, and the touch electrode bridge TEb may include an electrically conductive transparent material such as indium tin oxide (ITO), indium zinc oxide (IZO), etc. The plurality of first touch electrodes TE1, the plurality of second touch electrodes TE2, and the touch electrode bridge TEb may have a metal mesh shape.

Each of the plurality of first touch sensing lines TSL1 may include one end connected to each of the plurality of row line touch electrodes and the other end connected to the pad portion PA described in FIG. 1. That is, the plurality of row line touch electrodes may be connected to the touch controller (not shown) through the plurality of first touch sensing lines TSL1 and the pad portion PA.

Each of the plurality of second touch sensing lines TSL2 may include one end connected to each of the plurality of second touch electrodes TE2 and the other end connected to the pad portion PA. That is, the plurality of second touch electrodes TE2 may be connected to the touch controller through the plurality of second touch sensing lines TSL2 and the pad portion PA.

The touch controller may sequentially apply the touch detection signal to the plurality of second touch sensing lines TSL2, and may sense a touch position by checking change of the capacitance through the first touch sensing line TSL1.

Hereinafter, another example of the touch sensor area TSA included in the display device according to the exemplary embodiment will be described with reference to FIG. 13 and FIG. 14.

Figure 13:
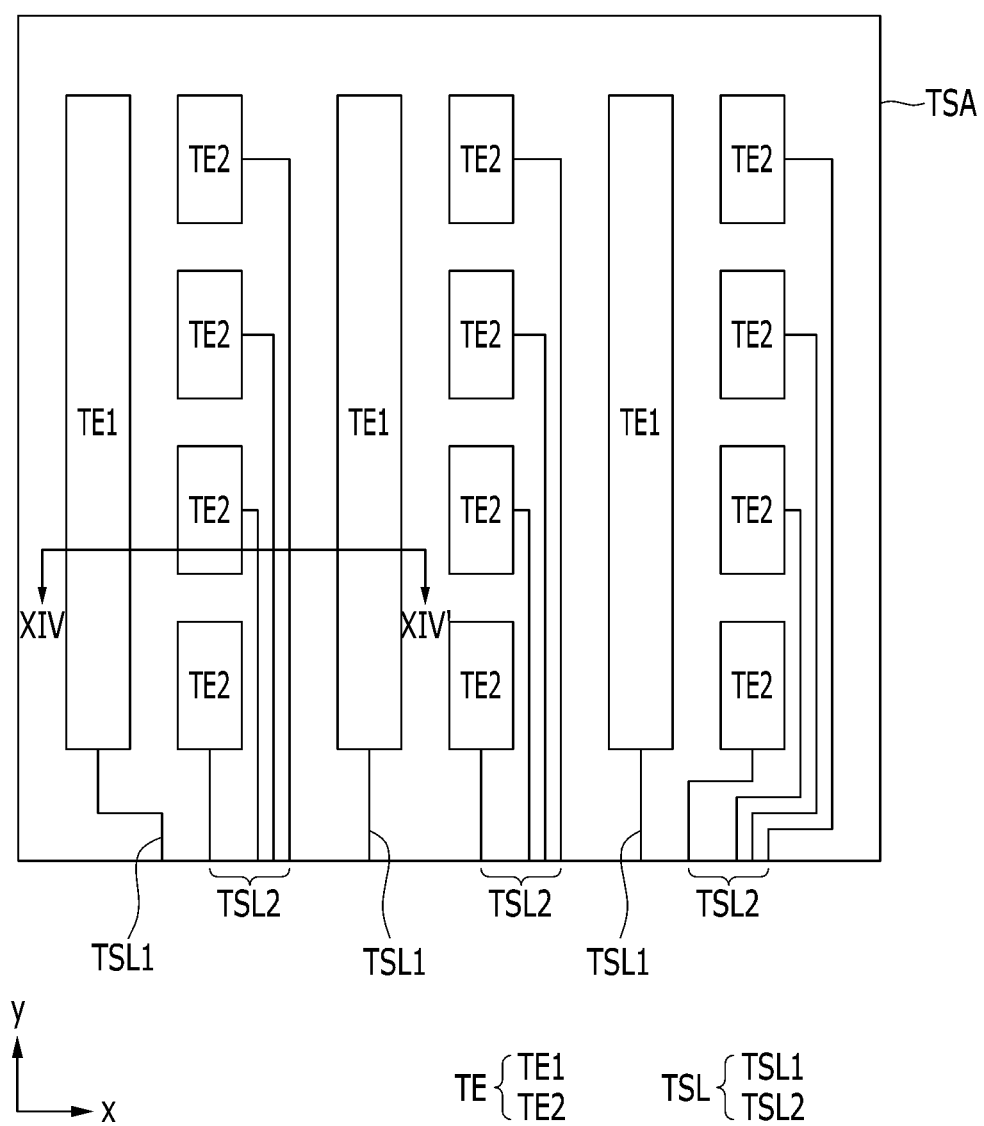
FIG. 13 illustrates a top plan view of another example of a touch sensor area of the display device of FIG. 1.

FIG. 13 illustrates a top plan view of another example of the touch sensor area of the display device of FIG. 1. FIG. 14 illustrates a cross-sectional view taken along line XIV-XIV' of FIG. 13.

Figure 14:
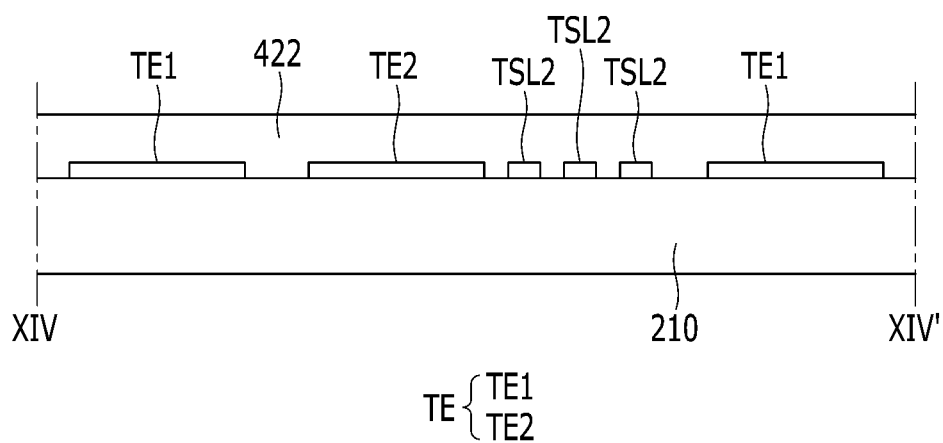
FIG. 14 illustrates a cross-sectional view taken along line XIV-XIV' of FIG. 13.

Referring to FIG. 13 and FIG. 14, the touch sensor area TSA according to another exemplary embodiment includes the plurality of touch electrodes TE and the plurality of touch sensing lines TSL, the plurality of touch electrodes TE include the plurality of first touch electrodes TE1 and the plurality of second touch electrodes TE2, and the plurality of touch sensing lines TSL include the plurality of first touch sensing lines TSL1 and the plurality of second touch sensing lines TSL2.

The plurality of first touch electrodes TE1 extend in the second direction y on the encapsulation layer 210, and are parallel to each other. The plurality of second touch electrodes TE2 are adjacent to the plurality of first touch electrodes TE1 on the encapsulation layer 210 to be positioned in a matrix form. The plurality of first touch electrodes TE1 and the plurality of second touch electrodes TE2 are alternately positioned in the first direction x. The second touch electrode TE2 may be smaller than the first touch electrode TE1, and the plurality of second touch electrodes TE2 may be arranged in the second direction y between the first touch electrodes TE1 adjacent thereto. The plurality of second touch electrodes TE2 that are adjacent to one first touch electrode TE1 to be arranged in the second direction y may generate a capacitance.

The plurality of first touch electrodes TE1 and the plurality of second touch electrodes TE2 may be positioned directly on the encapsulation layer 210, and may not overlap each other. That is, the plurality of first touch electrodes TE1 and the plurality of second touch electrodes TE2 may be positioned at the same layer. The interlayer insulating layer 422 may be positioned on the plurality of first touch electrodes TE1 and the plurality of second touch electrodes TE2. In this case, the first path wire 411 and the second path wire 412 described in FIG. 1 to FIG. 4 may be positioned directly on the encapsulation layer 210, and the first path wire 411 and the second path wire 412 may be positioned at the same layer as the plurality of first touch electrodes TE1 and the plurality of second touch electrodes TE2.

The plurality of first touch electrodes TE1 and the plurality of second touch electrodes TE2 may include an electrically conductive transparent material such as indium tin oxide (ITO), indium zinc oxide (IZO), etc. The plurality of first touch electrodes TE1 and the plurality of second touch electrodes TE2 may have a metal mesh shape.

Each of the plurality of first touch sensing lines TSL1 includes one end connected to each of the plurality of first touch electrodes TE1 and the other end connected to the pad portion PA described in FIG. 1. That is, the plurality of first touch electrodes TE1 may be connected to the touch controller (not shown) through the plurality of first touch sensing lines TSL1 and the pad portion PA.

Each of the plurality of second touch sensing lines TSL2 includes one end connected to each of the plurality of second touch electrodes TE2 and the other end connected to the pad portion PA. That is, the plurality of second touch electrodes TE2 may be connected to the touch controller through the plurality of second touch sensing lines TSL2 and the pad portion PA. Some of the plurality of second touch sensing lines TSL2 connected to the plurality of second touch electrodes TE2 positioned at the same row may be connected to each other in the flexible printed circuit board (FPCB) or the touch controller.

The touch controller may sequentially apply the touch detection signal to the plurality of first touch sensing lines TSL1, and may sense a touch position by checking change of the capacitance through the second touch sensing line TSL2.

Hereinafter, a display device according to another exemplary embodiment will be described with reference to FIG. 15 to FIG. 19. Compared with the display devices described in FIGS. 1 to 4, differences will be mainly described.

Figure 15:
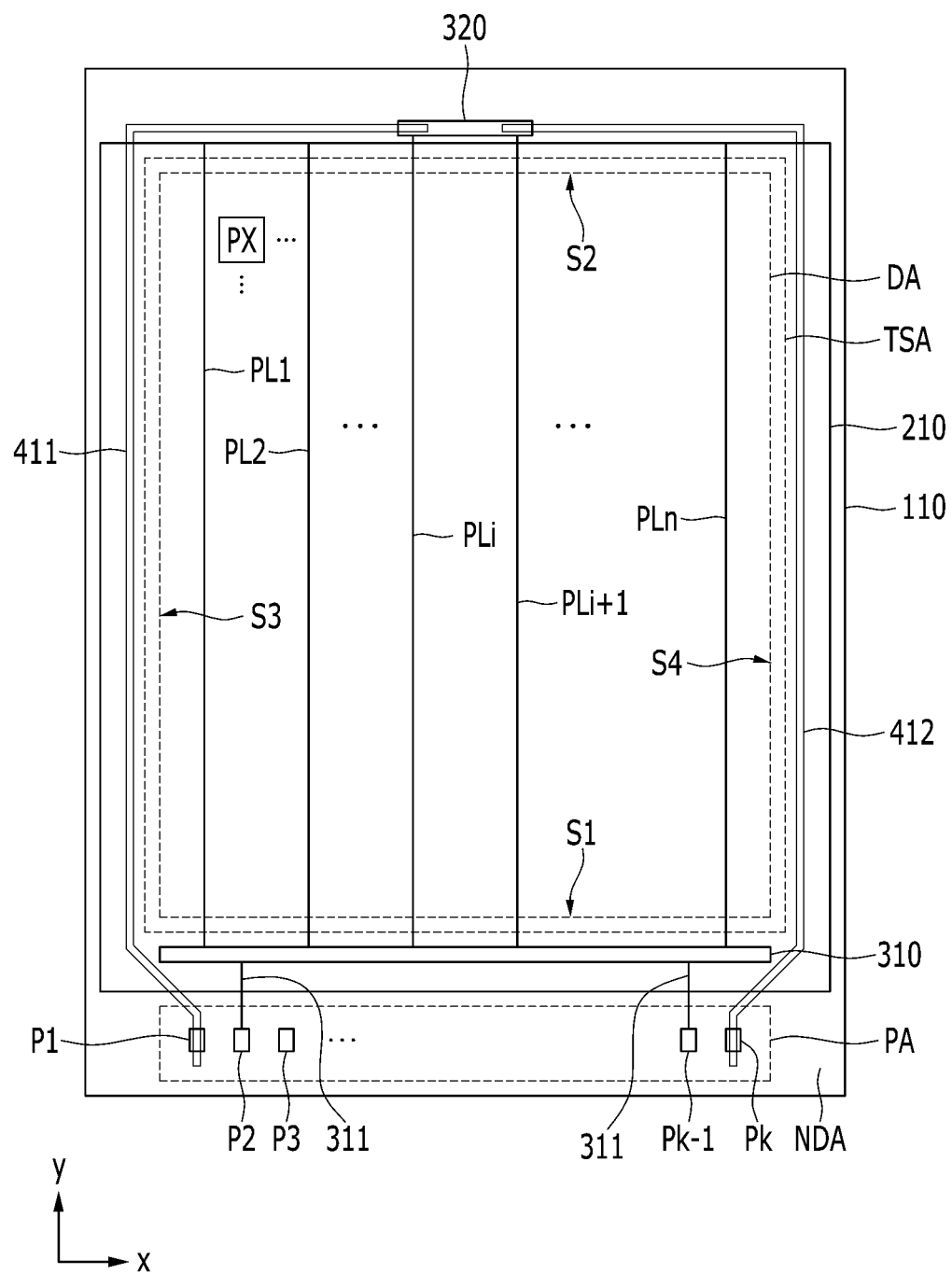
FIG. 15 schematically illustrates a top plan view of a display device according to another exemplary embodiment.

FIG. 15 schematically illustrates a top plan view of a display device according to another exemplary embodiment.

Referring to FIG. 15, the second common power wire 320 may extend in the first direction x along the second side S2 of the display area DA, and may be shorter than the second side S2 of the display area DA in the first direction x. The second common power wire 320 may be positioned to be adjacent to a central portion of the second side S2 of the display area DA.

The first path wire 411 may substantially extend in the second direction y along the third side S3 of the display area DA from the pad portion PA, and then it may extend in the first direction x along the second side S2 of the display area DA to be connected to the second common power wire 320.

The second path wire 412 may substantially extend in the second direction y along the fourth side S4 facing the third side S3 of the display area DA from the pad portion PA, and then it may extend in the first direction x along the second side S2 of the display area DA to be connected to the second common power wire 320.

The plurality of power supplying wires PL1-PLn respectively include one end connected to the first common power wire 310. That is, all of the plurality of power supplying wires PL1-PLn are connected to the first common power wire 310. Among the plurality of power supplying wires PL1-PLn, at least one power supplying wires PLi, PLi+1 positioned at the central portion of the second side S2 of the display area DA include the other ends connected to the second common power wire 320. That is, among the plurality of power supplying wires PL1-PLn, the central portion of the second side S2 of the display area DA, that is, at least one of power supplying wires PLi, PLi+1 positioned to be adjacent to the second common power wire 320, is connected to the first common power wire 310 and the second common power wire 320, and the remaining power supplying wires may not be connected to the second common power wire 320.

Except for these differences, since all of the features of the exemplary embodiments described above with reference to FIG. 1 to FIG. 4 may be applied to the exemplary embodiment described with reference to FIG. 15, the description for the features of the exemplary embodiments described above with reference to FIG. 1 to FIG. 4 will be omitted.

Figure 16:
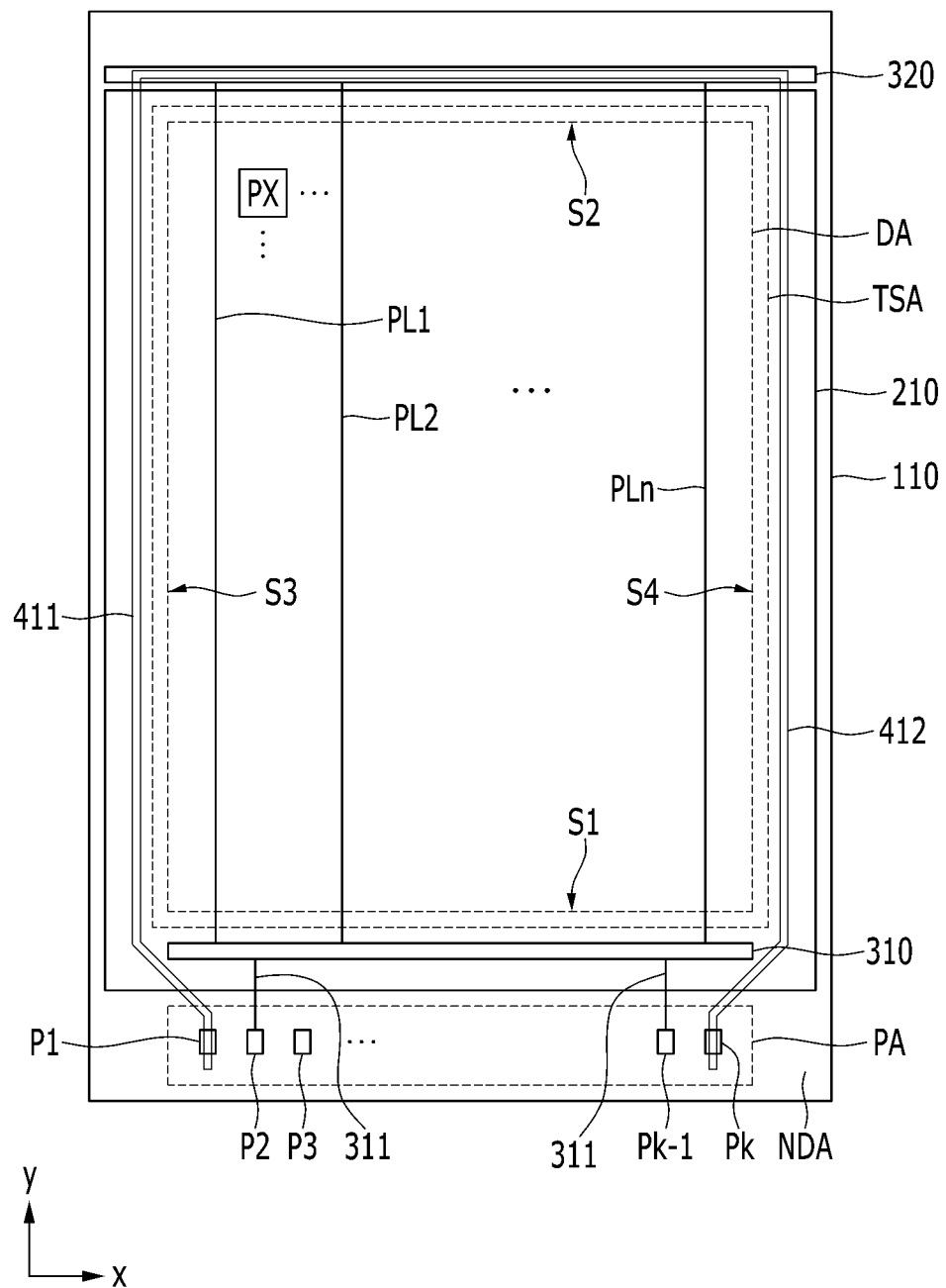
FIG. 16 schematically illustrates a top plan view of a display device according to another exemplary embodiment.

FIG. 16 schematically illustrates a top plan view of a display device according to another exemplary embodiment.

Referring to FIG. 16, the second common power wire 320 extends along the second side S2 of the display area DA, and is longer than the second side S2 of the display area DA in the first direction x.

In this case, the first path wire 411 substantially extends in the second direction y along the third side S3 of the display area DA from the pad portion PA, and then it may extend in the first direction x along the second side S2 of the display area DA to overlap the second common power wire 320. The first path wire 411 may be connected to the second common power wire 320 through the second contact hole H2 in an area overlapped with the second common power wire 320. The second path wire 412 may substantially extend in the second direction y along the fourth side S4 of the display area DA from the pad portion PA to be connected to the first path wire 411.

Alternatively, the second path wire 412 may substantially extend in the second direction y along the fourth side S4 of the display area DA from the pad portion PA, and then it may extend in the first direction x along the second side S2 of the display area DA to overlap the second common power wire 320. The second path wire 412 may be connected to the second common power wire 320 through the second contact hole H2 in an area overlapped with the second common power wire 320. The first path wire 411 may substantially extend in the second direction y along the third side S3 of the display area DA from the pad portion PA to be connected to the second path wire 412. In this case, the first path wire 411 and the second path wire 412 may be positioned at the same layer on the encapsulation layer 210.

Compared with FIG. 1, in the exemplary embodiment of FIG. 16, the area of the first path wire 411 overlapped with the second common power wire 320 is further widened, and correspondingly, it is possible to further widen the second contact hole H2 or to further increase the number thereof. Accordingly, it is possible to reduce the resistance of the first path wire 411 and the second common power wire 320 to which a power voltage is transmitted.

Except for these differences, since all of the features of the exemplary embodiments described above with reference to FIG. 1 to FIG. 4 may be applied to the exemplary embodiment described with reference to FIG. 16, the description for the features of the exemplary embodiments described above with reference to FIG. 1 to FIG. 4 will be omitted.

Figure 17:
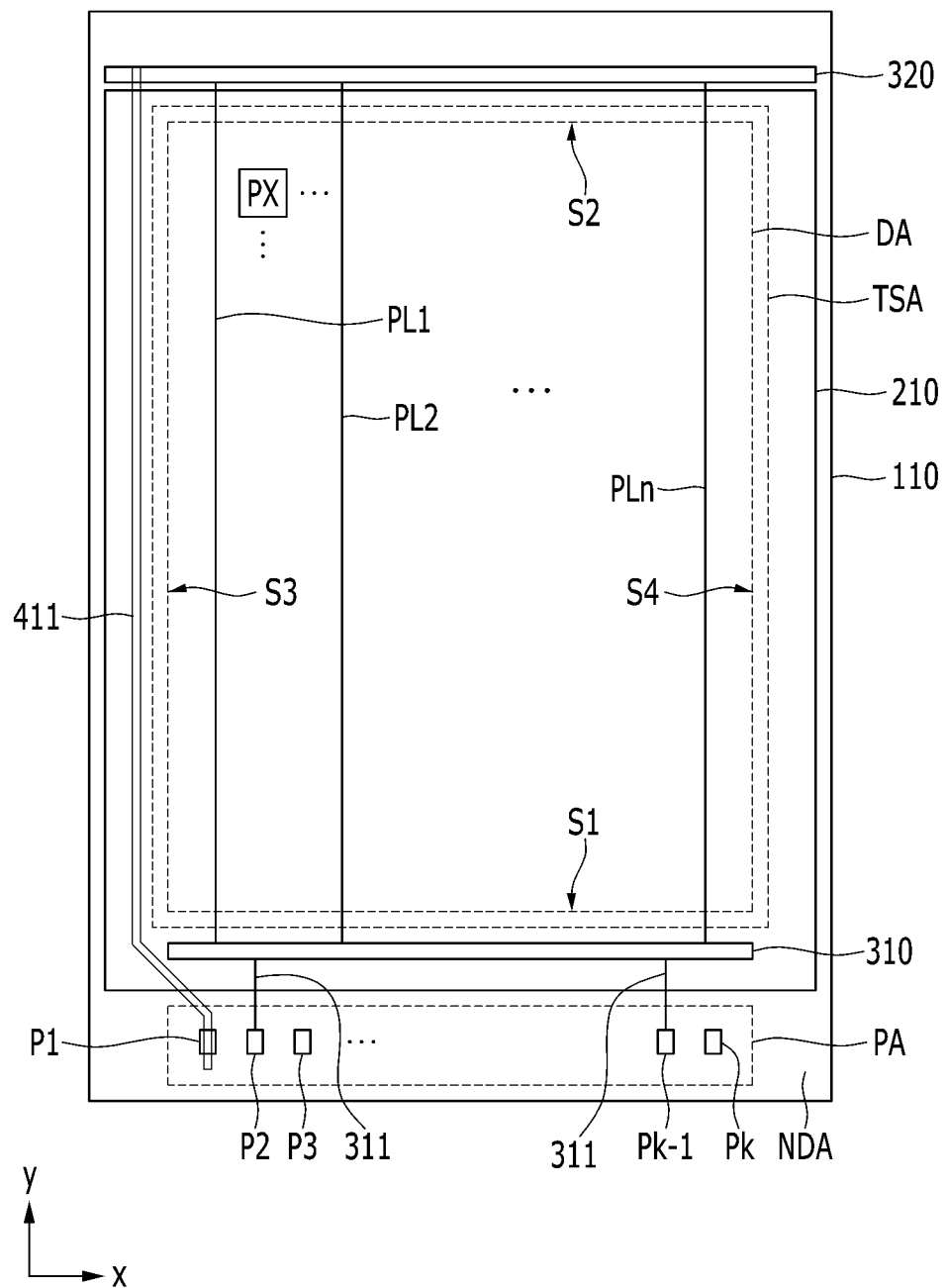
FIG. 17 schematically illustrates a top plan view of a display device according to another exemplary embodiment.

FIG. 17 schematically illustrates a top plan view of a display device according to another exemplary embodiment.

Referring to FIG. 17, the second common power wire 320 may be connected to the pad portion PA only through the first path wire 411. That is, compared with FIG. 1, the second path wire 412 is omitted.

Except for this difference, since all of the features of the exemplary embodiments described above with reference to FIG. 1 to FIG. 4 may be applied to the exemplary embodiment described with reference to FIG. 17, the description for the features of the exemplary embodiments described above with reference to FIG. 1 to FIG. 4 will be omitted.

Figure 18:
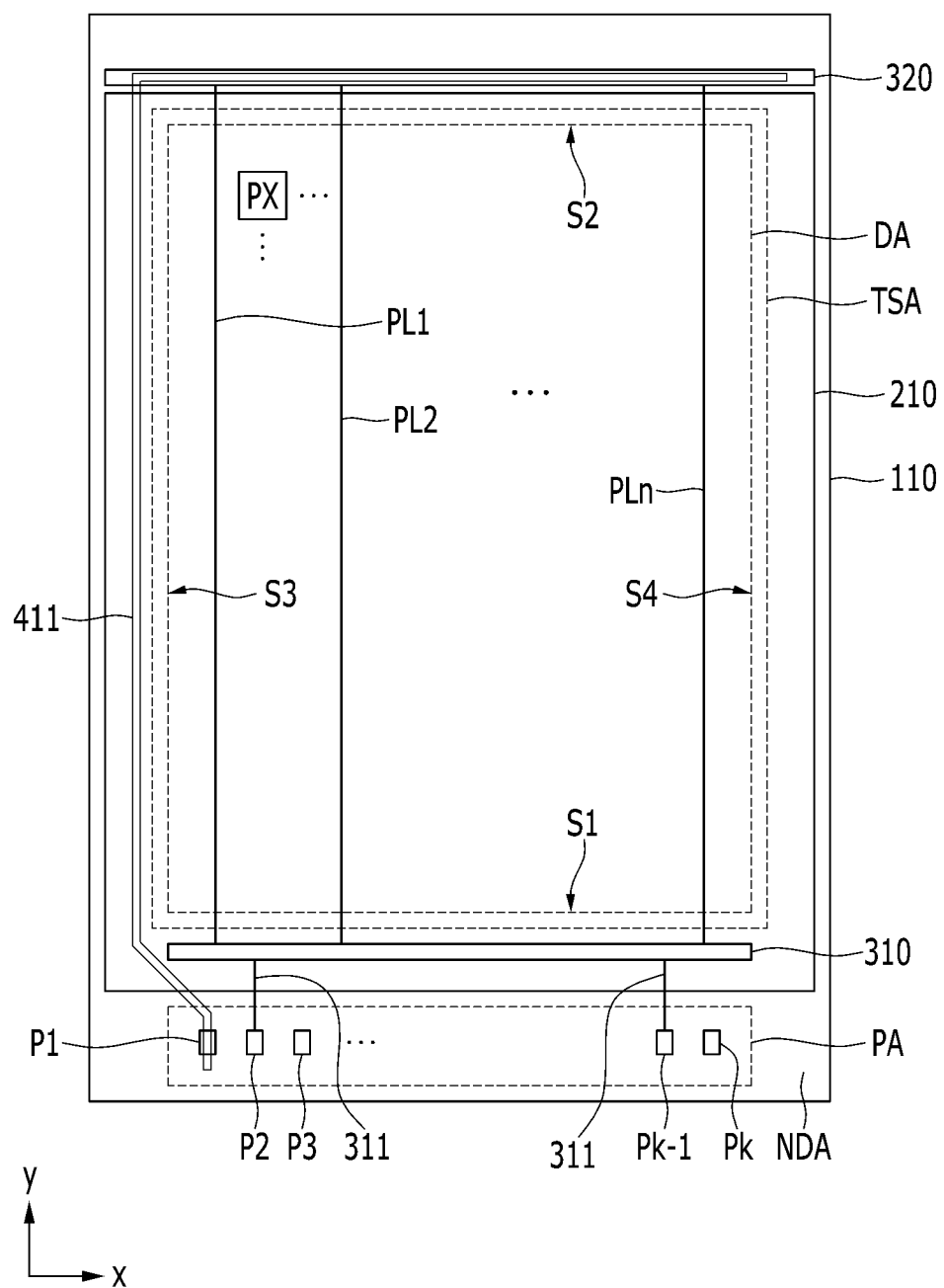
FIG. 18 schematically illustrates a top plan view of a display device according to another exemplary embodiment.

FIG. 18 schematically illustrates a top plan view of a display device according to another exemplary embodiment.

Referring to FIG. 18, the second common power wire 320 extends along the second side S2 of the display area DA, and is longer than the second side S2 of the display area DA in the first direction x.

In this case, the first path wire 411 may substantially extend in the second direction y along the third side S3 of the display area DA from the pad portion PA, and then it may extend in the first direction x along the second side S2 of the display area DA to overlap the second common power wire 320. The first path wire 411 may be connected to the second common power wire 320 through the second contact hole H2 in an area overlapped with the second common power wire 320. In this case, the second path wire 412 described in FIG. 1 is omitted.

Except for these differences, since all of the features of the exemplary embodiments described above with reference to FIG. 1 to FIG. 4 may be applied to the exemplary embodiment described with reference to FIG. 18, the description for the features of the exemplary embodiments described above with reference to FIG. 1 to FIG. 4 will be omitted.

Figure 19:
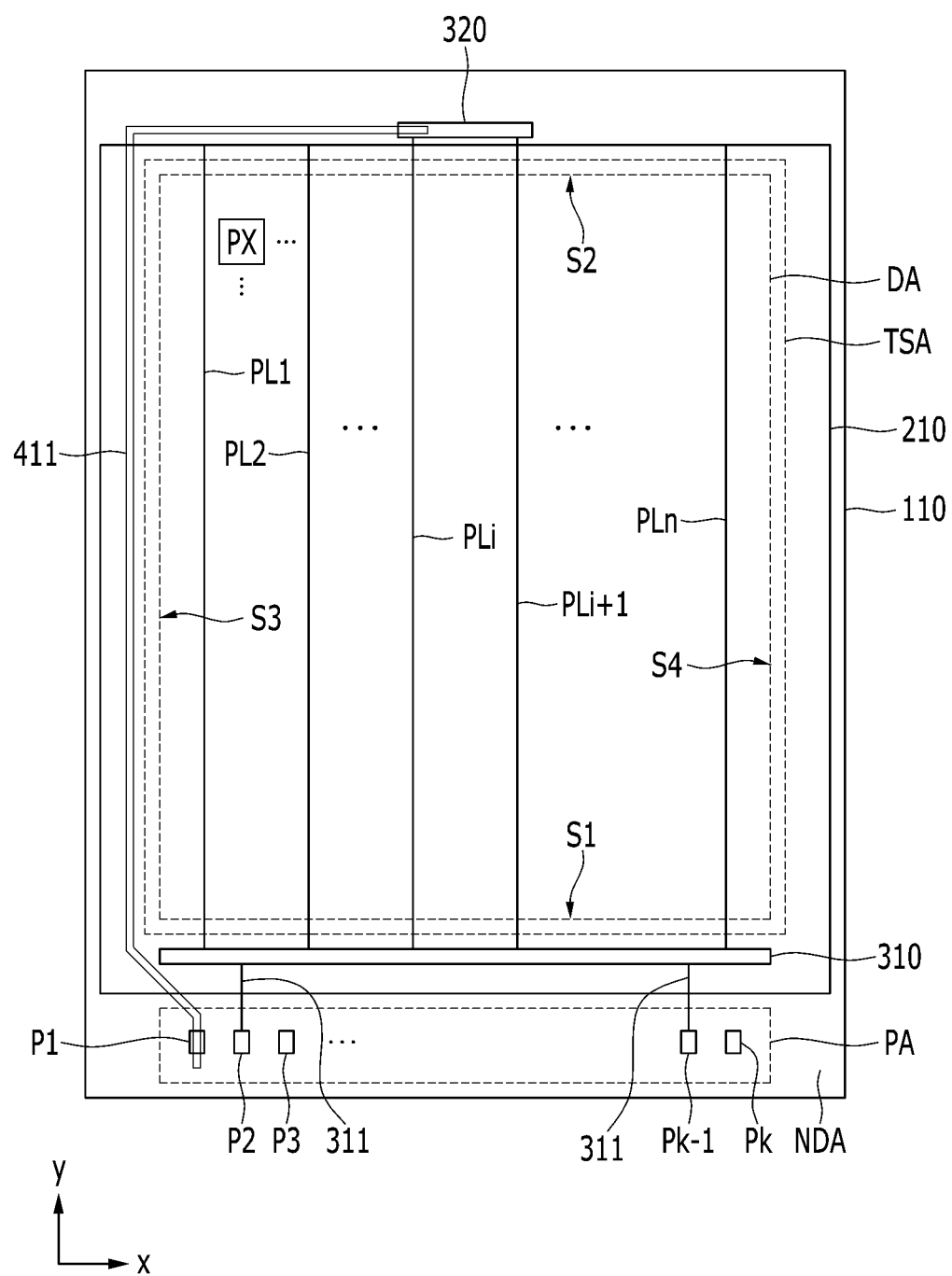
FIG. 19 schematically illustrates a top plan view of a display device according to another exemplary embodiment.

FIG. 19 schematically illustrates a top plan view of a display device according to another exemplary embodiment.

Referring to FIG. 19, the second common power wire 320 may extend in the first direction x along the second side S2 of the display area DA, and may be shorter than the second side S2 of the display area DA in the first direction x. In addition, the second common power wire 320 may be positioned to be adjacent to the central portion of the second side S2 of the display area DA.

The first path wire 411 may substantially extend in the second direction y along the third side S3 of the display area DA from the pad portion PA, and then it may extend in the first direction x along the second side S2 of the display area DA to be connected to the second common power wire 320. In this case, the second path wire 412 is omitted.

The plurality of power supplying wires PL1-PLn respectively include one end connected to the first common power wire 310. That is, all of the plurality of power supplying wires PL1-PLn are connected to the first common power wire 310. Among the plurality of power supplying wires PL1-PLn, the central portion of the second side S2 of the display area DA, that is, at least one of power supplying wires PLi, PLi+1 positioned to be adjacent to the second common power wire 320, includes the other ends connected to the second common power wire 320. That is, among the plurality of power supplying wires PL1-PLn, at least of one power supplying wires PLi, PLi+1 positioned at the central portion of the second side S2 of the display area DA is connected to the first common power wire 310 and the second common power wire 320, and the remaining power supplying wires may not be connected to the second common power wire 320.

Except for these differences, since all of the features of the exemplary embodiments described above with reference to FIG. 1 to FIG. 4 may be applied to the exemplary embodiment described with reference to FIG. 19, the description for the features of the exemplary embodiments described above with reference to FIG. 1 to FIG. 4 will be omitted.

Although certain exemplary embodiments and implementations have been described herein, other embodiments and modifications will be apparent from this description. Accordingly, the inventive concepts are not limited to such embodiments, but rather to the broader scope of the presented claims and various obvious modifications and equivalent arrangements.

What is claimed is:

1. A display device comprising:
a first substrate;
a display area comprising a plurality of pixels, each of which includes an organic light emitting diode, disposed on the first substrate;
a pad portion disposed adjacent to a first side of the display area and comprising a plurality of connecting pads disposed on the first substrate;
a first common power wire disposed between the display area and the pad portion and connected to a first connecting pad of the plurality of connecting pads to receive a power voltage;
a second common power wire disposed adjacent to a second side of the display area facing the first side;
an encapsulation layer disposed on the organic light emitting diode and overlapping an entirety of the display area to protect the plurality of pixels;
a first path wire comprising a first end connected to a second connecting pad of the plurality of connecting pads and a second end connected to the second common power wire and disposed on the encapsulation layer; and
a touch area comprising a plurality of touch electrodes disposed on the encapsulation layer to overlap the display area,
wherein the first path wire is disposed in a same layer as the plurality of touch electrodes, and
the first path wire is disposed outside of the display area and the touch area.

2. The display device of claim 1, wherein the first path wire extends along a third side of the display area from the pad portion to be connected to the second common power wire.

3. The display device of claim 2, wherein the second end of the first path wire overlaps the second common power wire.

4. The display device of claim 2, wherein the second common power wire extends along the second side of the display area, and is longer than the second side of the display area.

5. The display device of claim 4, wherein the first path wire extends along the second side of the display area on the second common power wire and overlaps the second common power wire.

6. The display device of claim 2, wherein the second common power wire extends along the second side of the display area, is shorter than the second side of the display area, and is disposed adjacent to a central portion of the second side of the display area.

7. The display device of claim 6, wherein the first path wire extends along the third side of the display area from the pad portion, and then extends along the second side of the display area to be connected to the second common power wire.

8. The display device of claim 2, further comprising a plurality of power supplying wires comprising first ends connected to the first common power wire and extending from the first common power wire to the second common power wire in the display area.

9. The display device of claim 8, wherein at least one of the plurality of power supplying wires is connected to the second common power wire.

10. The display device of claim 8, wherein:
the second common power wire extends along the second side of the display area and is longer than the second side of the display area; and
the plurality of power supplying wires are connected to the second common power wire.

11. The display device of claim 8, wherein:
the second common power wire extends along the second side of the display area, is shorter than the second side of the display area, and is disposed adjacent to a central portion of the second side of the display area; and
at least one power supplying wire disposed at the central portion of the second side of the display area of the plurality of power supplying wires is connected to the second common power wire.

12. The display device of claim 2, further comprising a second path wire comprising a first end connected to a third connecting pad of the plurality of connecting pads and a second end connected to the second common power wire and disposed on the encapsulation layer.

13. The display device of claim 12, wherein the second path wire is disposed the same layer as the plurality of touch electrodes, and extends along an edge of a fourth side of the display area facing the third side from the pad portion to be connected to the second common power wire.

14. The display device of claim 13, wherein the second end of the second path wire overlaps the second common power wire.

15. The display device of claim 13, wherein:
the second common power wire extends along the second side of the display area, is shorter than the second side of the display area, and is disposed adjacent to a central portion of the second side of the display area; and
the second path wire extends along the edge of the fourth side of the display area from the pad portion, and then extends along the second side of the display area to be connected to the second common power wire.

16. The display device of claim 13, wherein:
the second common power wire extends along the second side of the display area and is longer than the second side of the display area; and
the second path wire extends along the second side of the display area on the second common power wire and overlaps the second common power wire.

17. The display device of claim 16, wherein the first path wire and the second path wire are connected to each other.

18. The display device of claim 17, wherein the first path wire and the second path wire are disposed at the same layer.

* * * * *